(12) United States Patent
Shin et al.

(10) Patent No.: US 12,217,680 B2
(45) Date of Patent: Feb. 4, 2025

(54) DISPLAY DEVICE HAVING SUB-PIXELS THAT SHARE A HORIZONTAL POWER LINE

(71) Applicant: Samsung Display Co., LTD., Yongin-si (KR)

(72) Inventors: Dong Hee Shin, Yongin-si (KR); Sun Kwun Son, Yongin-si (KR); Sang Yong No, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/359,965

(22) Filed: Jul. 27, 2023

(65) Prior Publication Data

US 2024/0233638 A1 Jul. 11, 2024

(30) Foreign Application Priority Data

Jan. 10, 2023 (KR) .......................... 10-2023-0003627

(51) Int. Cl.
  *G09G 3/32* (2016.01)
  *G09G 3/3233* (2016.01)
  *G09G 3/3283* (2016.01)

(52) U.S. Cl.
  CPC ......... *G09G 3/3233* (2013.01); *G09G 3/3283* (2013.01)

(58) Field of Classification Search
  None
  See application file for complete search history.

(56) References Cited

U.S. PATENT DOCUMENTS

| 10,038,049 | B2 | 7/2018 | Gang et al. | |
| 2001/0054991 | A1* | 12/2001 | Kimura | H01L 29/78621 257/E27.113 |
| 2015/0187859 | A1* | 7/2015 | Choi | G09G 3/3225 257/72 |
| 2017/0168333 | A1* | 6/2017 | Kubota | H01L 27/1266 |
| 2018/0188615 | A1* | 7/2018 | Li | G02F 1/134309 |
| 2020/0380920 | A1* | 12/2020 | Lee | G09G 3/3291 |
| 2021/0193774 | A1* | 6/2021 | Won | H10K 59/128 |
| 2022/0028954 | A1* | 1/2022 | Li | H10K 59/131 |
| 2022/0076602 | A1* | 3/2022 | Dong | G09G 3/3225 |

FOREIGN PATENT DOCUMENTS

KR 10-2018-0014381 2/2018

* cited by examiner

*Primary Examiner* — Amr A Awad
*Assistant Examiner* — Donna V Bocar
(74) *Attorney, Agent, or Firm* — KILE PARK REED & HOUTTEMAN PLLC

(57) ABSTRACT

A display device includes a first vertical power line extending in a first direction and receiving a first power source; and a first horizontal power line extending in a second direction intersecting the first direction between a first pixel and a second pixel and receiving the first power source, each of the first pixel and the second pixel includes first to third sub-pixels sequentially disposed in the first direction, the first pixel includes a first common pattern between the first sub-pixel and the second sub-pixel extending in the second direction, the first sub-pixel of the first pixel and the second sub-pixel of the first pixel share the first common pattern and are connected to the first vertical power line, and the third sub-pixel of the first pixel shares the first horizontal power line with the first sub-pixel of the second pixel.

20 Claims, 15 Drawing Sheets

DISPLAY DEVICE HAVING SUB-PIXELS THAT SHARE A HORIZONTAL POWER LINE

CROSS-REFERENCE TO RELATED APPLICATION(S)

This application claims priority to and benefits of Korean Patent Application No. 10-2023-0003627 under 35 U.S.C. § 119 on Jan. 10, 2023 in the Korean Intellectual Property Office, the entire contents of which are incorporated herein by reference.

BACKGROUND

1. Technical Field

The disclosure relates to a display device.

2. Description of the Related Art

Recently, as interest in an information display is increasing, research and development for display devices are continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure has been made in an effort to provide a display device that may secure reliability of the display device by securing capacity of a storage capacitor forming a pixel circuit of a sub-pixel.

Objects of the disclosure are not limited to the above-described objects, and may be variously modified without departing from the spirit and scope of the disclosure.

The technical objectives to be achieved by the disclosure are not limited to those described herein, and other technical objectives that are not mentioned herein would be clearly understood by a person skilled in the art from the description of the disclosure.

An embodiment provides a display device that may include a first pixel disposed on a substrate; a second pixel spaced apart from the first pixel in a first direction; a first vertical power line extending in the first direction and receiving a first power source; and a first horizontal power line extending in a second direction intersecting the first direction between the first pixel and the second pixel and receiving the first power source, wherein each of the first pixel and the second pixel may include a first sub-pixel, a second sub-pixel and a third sub-pixel that are sequentially disposed in the first direction, the first pixel may include a first common pattern disposed between the first sub-pixel and the second sub-pixel to extend in the second direction, the first sub-pixel of the first pixel and the second sub-pixel of the first pixel share the first common pattern and are electrically connected to the first vertical power line, and the third sub-pixel of the first pixel shares the first horizontal power line with the first sub-pixel of the second pixel.

Each of the first sub-pixel, the second sub-pixel and the third sub-pixel may include a light emitting element; a first transistor controlling a current of the light emitting element; and a storage capacitor that may include a lower electrode electrically connected to a gate electrode of the first transistor and an upper electrode electrically connected to a source electrode of the first transistor.

The first common pattern may be an active pattern of the first transistor of the first sub-pixel of the first pixel and an active pattern of the first transistor of the second sub-pixel of the first pixel.

The first common pattern may be a protruding pattern protruding from the first vertical power line in the second direction.

The first common pattern and the first vertical power line may be disposed on a same layer.

The first common pattern may be a conductive pattern doped with an N+ type dopant.

The second pixel may be symmetrical to the first pixel about an axis in the second direction.

The display device may further include a second common pattern extending in the second direction between the second sub-pixel of the second pixel and the third sub-pixel of the second pixel, wherein the second sub-pixel of the second pixel and the third sub-pixel of the second pixel may be electrically connected to the first vertical power line through the second common pattern.

The first sub-pixel may emit light of a first color, the second sub-pixel may emit light of a second color different from the first color, the third sub-pixel may emit light of a third color different from the first color and the second color.

The display device may further include a third pixel spaced apart from the second pixel in the first direction, wherein the third pixel may include the first sub-pixel, the second sub-pixel and the third sub-pixel of the first pixel, and the display device may further include a second horizontal power line supplying a second power source between the second pixel and the third pixel; a second scan line of the second pixel disposed between the third sub-pixel of the second pixel and the second horizontal power line and extends in the second direction; and a third scan line of the third pixel disposed between the second horizontal power line and the first sub-pixel of the third pixel and extends in the second direction.

The display device may further include a second power line receiving a second power source different from the first power source; a sensing line that transmits a control signal to each of the first sub-pixel, the second sub-pixel and the third sub-pixel and extends in the first direction; and a data line that transmits a data signal to each of the first sub-pixel, the second sub-pixel and the third sub-pixel and extends in the first direction, wherein the second power line and the first vertical power line may be disposed at a left side of the storage capacitor, and the sensing line and the data line may be disposed at a right side of the storage capacitor.

Each of the first sub-pixel, the second sub-pixel and the third sub-pixel may further include a second transistor electrically connected between the data line and the gate electrode of the first transistor and turned on by a scan signal; and a third transistor electrically connected to the sensing line and the upper electrode of the storage capacitor and turned on by a control signal.

The upper electrode of the storage capacitor and an active pattern of each of the first transistor, the second transistor and the third transistor may be disposed on a same layer.

The upper electrode of the storage capacitor may be integral with the source electrode of the first transistor and the source electrode of the third transistor.

The light emitting element may include a first electrode; a light emitting layer disposed on the first electrode; and a second electrode disposed on the light emitting layer, and the first electrode may be electrically connected to the source electrode of the first transistor through a contact portion.

An embodiment provides a display device that may include a first pixel disposed on a substrate; and a first vertical power line extending in a first direction and supplying a first power source, wherein the first pixel may include a first sub-pixel, a second sub-pixel and a third sub-pixel disposed sequentially in the first direction; a first electrode pattern disposed between the first sub-pixel and the second sub-pixel and extending in a second direction intersecting the first direction; and a second electrode pattern disposed between the second sub-pixel and the third sub-pixel and extending in the second direction, and the first sub-pixel and the second sub-pixel share the first electrode pattern to be electrically connected to the first vertical power line, and the third sub-pixel is electrically connected to the first vertical power line through the second electrode pattern.

Each of the first sub-pixel, the second sub-pixel and the third sub-pixel may include a light emitting element; a first transistor controlling a current of the light emitting element; and a storage capacitor that may include a lower electrode electrically connected to a gate electrode of the first transistor and an upper electrode electrically connected to a source electrode of the first transistor, and the first electrode pattern may be an active pattern of the first transistor of the first sub-pixel of the first pixel and an active pattern of the first transistor of the second sub-pixel of the first pixel.

The display device may further include a second pixel spaced apart from the first pixel in the first direction, wherein the second pixel and the first pixel may have a same structure.

Each of the first electrode pattern and the second electrode pattern may be a power line protruding from the first vertical power line in the second direction.

The first electrode pattern and the second electrode pattern may be conductive patterns doped with an N+ type dopant.

According to embodiments, sub-pixels are electrically connected to a power line supplying a first driving power source through a common pattern disposed between the sub-pixels, so that an area of a storage capacitor may be secured by reducing an area of a gate electrode of a first transistor (or driving transistor) of each sub-pixel.

According to an embodiment, it is possible to provide a display device with improved reliability by increasing capacity of a storage capacitor of each sub-pixel.

However, the effects of the disclosure are not limited to the above-described effects, and may be variously extended without departing from the spirit and scope of the disclosure.

BRIEF DESCRIPTION OF THE DRAWINGS

The above and other objects and features of the present disclosure will become apparent by describing in detail embodiments thereof with reference to the accompanying drawings. in which.

DETAILED DESCRIPTION OF THE EMBODIMENTS

Figure 1:
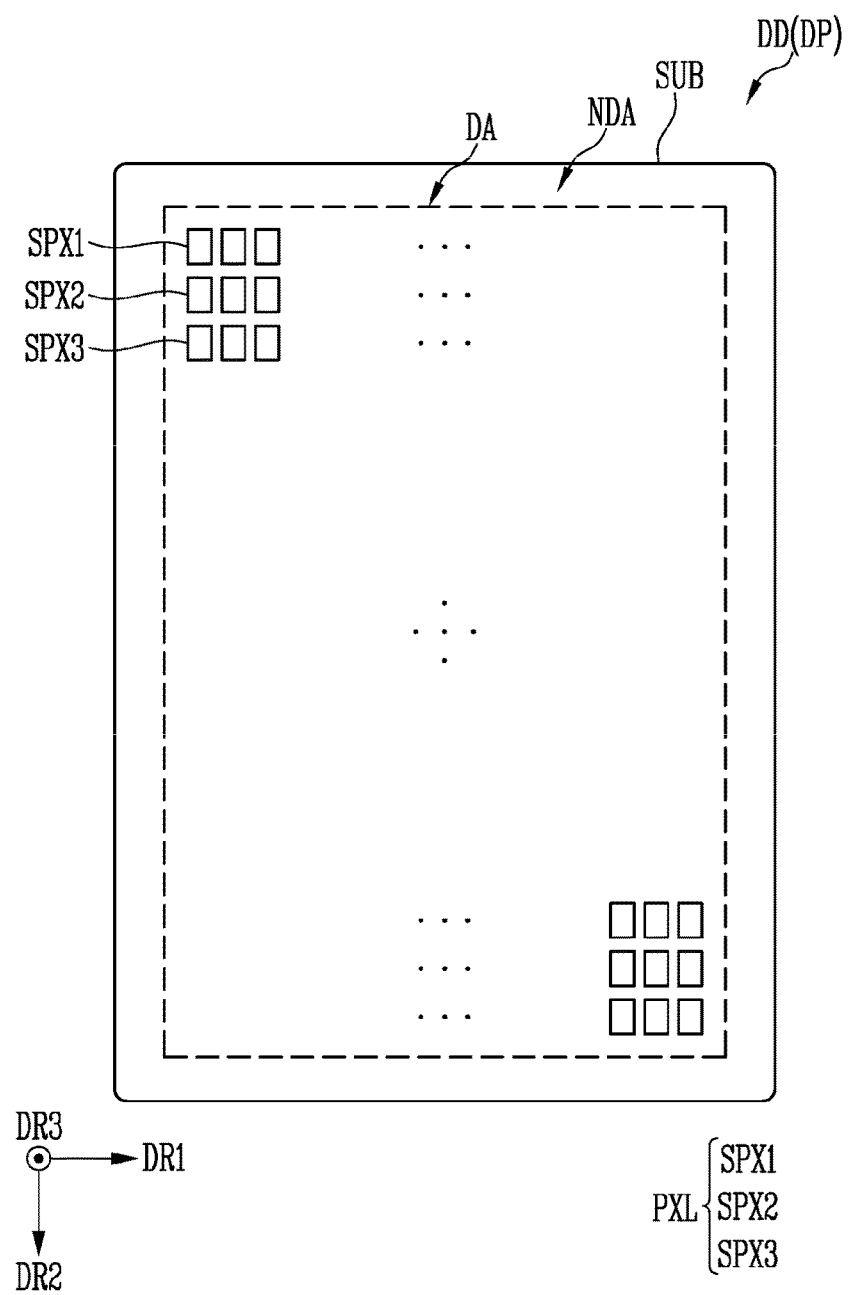
FIG. 1 illustrates a schematic top plan view of a display device according to an embodiment sure.

Hereinafter, an embodiment will be described in detail with reference to the accompanying drawings. The same reference numerals are used for the same constituent elements on the drawings, and duplicate descriptions for the same constituent elements may be omitted.

In the drawings, sizes, thicknesses, ratios, and dimensions of the elements may be exaggerated for ease of description and for clarity. Like numbers refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or.

It will be further understood that the terms "comprise", "comprise", "have", etc. when used in the present disclosure, specify the presence of stated features, integers, steps, operations, elements, components, and/or combinations of them but do not preclude the presence or addition of one or more other features, integers, steps, operations, elements, components, and/or combinations thereof. "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Furthermore, in case that a first part such as a layer, a film, a region, or a plate is disposed on a second part, the first part may be not only directly on the second part but a third part or other parts may intervene between them. In addition, when it is expressed that a first part such as a layer, a film, a region, or a plate is formed on a second part, the surface of the second part on which the first part is formed is not limited to an upper surface of the second part but may comprise other surfaces such as a side surface or a lower surface of the second part. To the contrary, in case that a first part such as a layer, a film, a region, or a plate is under or below a second part, the first part may be not only directly under or below the second part but a third part or other parts may intervene between them.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. The term "overlap" or "overlapped" means that a first object may be above or below or to a side of a second object, and vice versa.

Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein and should not be interpreted in an ideal or overly formal sense unless so defined or implied herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Figure 2:
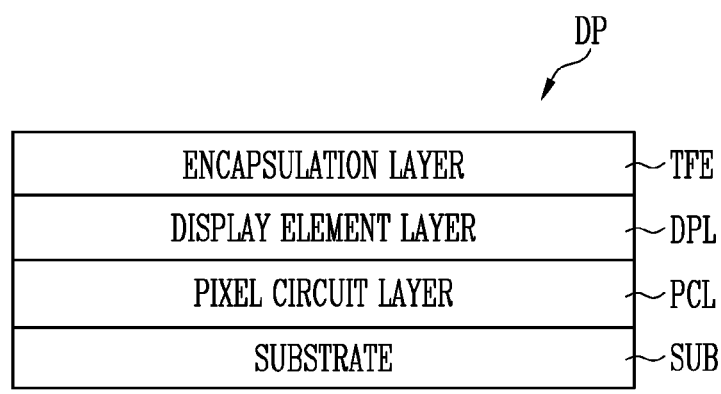
FIG. 2 illustrates a schematic cross-sectional view of a display panel of FIG. 1.

FIG. 1 illustrates a schematic top plan view of a display device according to an embodiment of the disclosure. FIG. 2 illustrates a schematic cross-sectional view of a display panel of FIG. 1.

In FIG. 1 and FIG. 2, a structure of a display device DD and a display panel DP included in the display device DD is briefly illustrated based on a display area DA in which an image is displayed.

In FIG. 1 and FIG. 2, for better understanding and ease of description, a structure of the display device DD, by way of example, the display panel DP included in the display device DD is briefly illustrated based on the display area DA in which an image is displayed.

Referring to FIG. 1 and FIG. 2, the display panel DP (or the display device DD) according to the embodiment may be provided in various shapes, for example, may be provided in a rectangular plate shape having two pairs of sides parallel to each other, but is not limited thereto. In case that the display panel DP is provided in the rectangular plate shape, sides of one pair of the two pairs of sides may be provided to be longer than sides of the other pair thereof.

At least a portion of the display panel DP may have flexibility, and the display panel DP may be folded at the portion having the flexibility, but is not limited thereto.

The display panel DP may display an image. As the display panel DP, a self-light emitting display panel such as an organic light emitting display panel (OLED panel) using an organic light emitting diode as a light emitting element, a micro-LED or nano-LED display panel using an ultra small light emitting diode as a light emitting element, or a quantum dot organic light emitting display panel (QD OLED panel) using a quantum dot and an organic light emitting diode may be used. As the display panel DP, a non-light emitting display panel such as a liquid crystal display panel (LCD panel), an electro-phoretic display panel (EPD panel), or an electro-wetting display panel (EWD panel) may be used. In case that a non-light emitting display panel is used as the display panel DP, the display device DD may include a backlight unit that supplies light to the display panel DP.

The display panel DP may include a substrate SUB and pixels PXL provided on the substrate SUB.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

One area or an area of the substrate SUB is provided as the display area DA in which pixels PXL are disposed, and the remaining area of the substrate SUB may be provided as a non-display area NDA. For example, the substrate SUB may include the display area DA including pixel areas in which respective pixels PXL are disposed, and the non-display area NDA disposed around the display area DA (or adjacent to the display area DA).

The non-display area NDA may be disposed to be adjacent to the display area DA. The non-display area NDA may be provided in at least one side or a side of the display area DA. For example, the non-display area NDA may surround a circumference (or edge) of the display area DA. The non-display area NDA may be provided with a wire portion connected to each pixel PXL and a driver connected to the wire portion and driving the pixel PXL.

The pixel PXL may include sub-pixels. For example, the PXL may include a first sub-pixel SPX1, a second sub-pixel SPX2, and a third sub-pixel SPX3. The first sub-pixel SPX1, the second sub-pixel SPX2, and the third sub-pixel SPX3 may be sequentially disposed in a second direction DR2. However, they are not limited thereto, and the first sub-pixel SPX1, the second sub-pixel SPX2, and the third sub-pixel SPX3 may be sequentially disposed in a first direction DR1 intersecting the second direction DR2. The first direction DR1 and the second direction DR2 may be considered as relative terms within the spirit and the scope of the disclosure.

The first, second, and third sub-pixels SPX1, SPX2, and SPX3 may light emit in different colors. For example, the first sub-pixel SPX1 may be a red sub-pixel emitting light in red, the second sub-pixel SPX2 may be a blue sub-pixel emitting light in blue, and the third sub-pixel SPX3 may be a green sub-pixel emitting light in green. However, the color, type, and/or number of the sub-pixels forming the pixel PXL are not particularly limited, and for example, the color of light emitted by each of the sub-pixels SPX1, SPX2, and SPX3 may be variously changed.

In an embodiment, the first, second, and third sub-pixels SPX1, SPX2, and SPX3 may emit light of the same color. For example, all of the first, second, and third sub-pixels SPX1, SPX2, and SPX3 may be sub-pixels emitting red, green, or blue light. In order to form a full-color pixel PXL, an optical layer such as a light conversion layer and/or a color filter for converting a color of light emitted from a corresponding unit pixel may be disposed on at least some of the first, second, and third sub-pixels SPX1, SPX2, and SPX3.

In the following embodiment, in case that the first sub-pixel SPX1, the second sub-pixel SPX2, and the third sub-pixel SPX3 are comprehensively named, they will be referred to as a sub-pixel SPX.

Pixels PXL may be provided to be arranged or disposed in a matrix format along a row extending in the first direction DR1 and a column extending in the second direction DR2 intersecting the first direction DR1. The disposition of the pixels PXL is not particularly limited, and the pixels PXL may be disposed in various forms. In an embodiment, in case that pixels PXL are provided, they may be provided to have different areas (or sizes). For example, in the case in which the pixels PXL have different colors of emitted light, the pixels PXL for each color may be provided in different areas (or sizes) or in different shapes.

The driver may provide a selectable signal and a selectable power source to each pixel PXL through the wire portion, thereby controlling driving of the pixel PXL.

The display panel DP (or each of the pixels PXL) may include a pixel circuit layer PCL, a display element layer DPL, and an encapsulation layer TFE disposed on the substrate SUB.

The pixel circuit layer PCL is provided on the substrate SUB, and may include transistors and signal wires connected to the transistors. For example, each transistor may have a structure in which a semiconductor pattern, a gate electrode, a source electrode, and a drain electrode may be sequentially stacked each other with an insulating layer interposed therebetween. The semiconductor pattern may include an amorphous silicon, a poly silicon, a low temperature poly silicon, an organic semiconductor, and/or an oxide semiconductor. The gate electrode, the source electrode, and the drain electrode may include one of aluminum (Al), copper (Cu), titanium (Ti), and molybdenum (Mo), but is not limited thereto. The pixel circuit layer PCL may include at least one or more insulating layers.

The display element layer DPL may be disposed on the pixel circuit layer PCL. The display element layer DPL may include a light emitting element that emits light. The light emitting element may be, for example, an organic light emitting diode, but is not limited thereto. In an embodiment, the light emitting element may be an inorganic light emitting element including an inorganic light emitting material or a light emitting element that emits light by changing a wavelength of light emitted by using a quantum dot.

The encapsulation layer TFE may be disposed on the display element layer DPL. The encapsulation layer TFE may be an encapsulation substrate or a multi-layered encapsulation film. In case that the encapsulation layer TFE is in a form of the encapsulation film, it may include an inorganic film and/or an organic film. For example, the encapsulation layer TFE may have a structure in which an inorganic film, an organic film, and an inorganic film may be sequentially stacked each other. The encapsulation layer TFE may prevent external air and moisture from penetrating into the display element layer DPL and the pixel circuit layer PCL.

Figure 3:
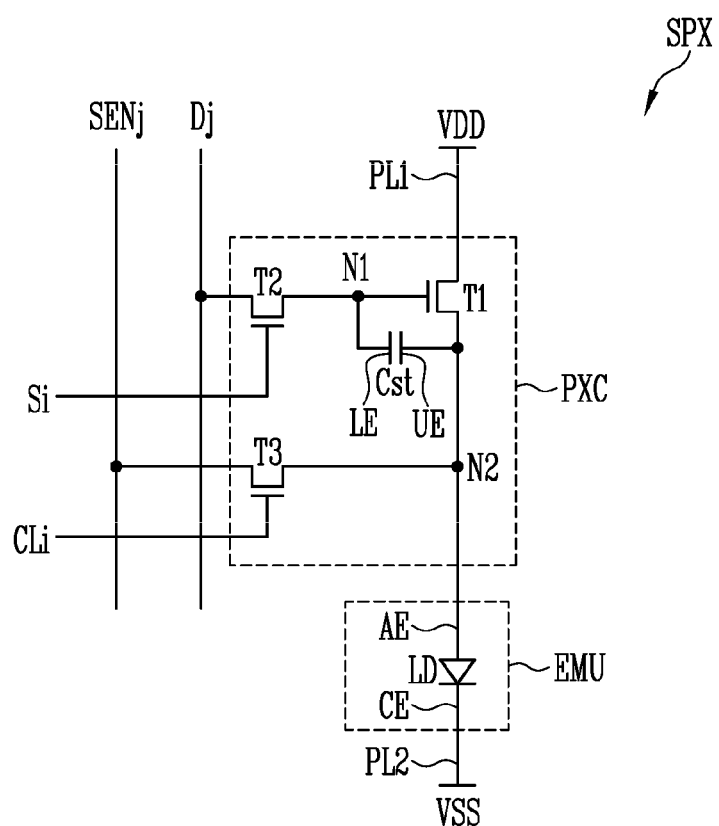
FIG. 3 illustrates a schematic diagram of an equivalent circuit of a sub-pixel of FIG. 1.

FIG. 3 illustrates a schematic diagram of an equivalent circuit of the sub-pixel of FIG. 1.

In FIG. 3, for better understanding and ease of description, a pixel PXL disposed in an i-th pixel row (or an i-th horizontal line) and a j-th pixel column is illustrated (wherein i and j are natural numbers).

Referring to FIG. 1 to FIG. 3, the sub-pixel SPX may include a light emitting portion EMU that generates light with luminance corresponding to a data signal. The pixel PXL may further include a pixel circuit PXC for driving the light emitting portion EMU.

The light emitting portion EMU may include a light emitting element LD connected between a first power line PL1 receiving a voltage of a first driving power source VDD (or a first power source) and a second power line PL2 receiving a voltage of a second driving power source VSS (or a second power source). For example, the light emitting portion EMU may include the light emitting element LD including a first electrode AE connected to the first driving power source VDD via the pixel circuit PXC and the first power line PL1 and a second electrode CE connected to the second driving power source VSS via the second power line PL2. The first electrode AE may be an anode, and the second electrode CE may be a cathode. The first driving power source VDD and the second driving power source VSS may have different potentials. A potential difference between the first and second driving power sources VDD and VSS may be set to be equal to or higher than a threshold voltage of the light emitting element LD during a light emitting period of the sub-pixel SPX.

In case that the sub-pixel SPX is disposed in an i-th pixel row and a j-th pixel column in the display area DA, the pixel circuit PXC of the pixel PXL (or the sub-pixel) may be electrically connected to an i-th scan line Si and a j-th data line Dj. The pixel circuit PXC may be electrically connected to an i-th control line CLi and a j-th sensing line SENj.

The pixel circuit PXC described above may include first to third transistors T1, T2, and T3 and a storage capacitor Cst.

The first transistor T1 is a driving transistor for controlling a driving current applied to the light emitting element LD, and may be electrically connected between the first driving power source VDD and the light emitting element LD. For example, a first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of the driving current applied to the light emitting element LD from the first driving power source VDD through the second node N2 according to a voltage applied to the first node N1. In the embodiment, the first terminal of the first transistor T1 may be a drain electrode, and the second terminal of the first transistor T1 may be a source electrode, but the disclosure is not limited thereto. In an embodiment, the first terminal thereof may be a source electrode, and the second terminal thereof may be a drain electrode.

The second transistor T2 is a switching transistor that selects the sub-pixel SPX in response to a scan signal and activates the sub-pixel SPX, and may be electrically connected between the data line Dj (for example, the j-th data line) and the first node N1. A first terminal of the second transistor T2 may be electrically connected to the data line Dj, a second terminal of the second transistor T2 may be electrically connected to the first node N1 (or the gate electrode of the first transistor T1), and a gate electrode of the second transistor T2 may be electrically connected to the scan line Si (or the i-th scan line). The first terminal and the second terminal of the second transistor T2 are different terminals, and for example, in case that the first terminal is a drain electrode, the second terminal may be a source electrode.

In case that a scan signal of a gate-on voltage (for example, a high level voltage) is supplied from the scan line Si, the second transistor T2 may be turned on to electrically connect the data line Dj and the first node N1. The first node N1 is a point at which the second terminal of the second transistor T2 is connected to the gate electrode of the first transistor T1, and the second transistor T2 may transmit a data signal to the gate electrode of the first transistor T1.

The third transistor T3 electrically connects the first transistor T1 to the sensing line SENj (for example, the j-th sensing line), so that it may obtain a sensing signal through the sensing line SENj, and may detect a characteristic of the sub-pixel SPX in addition to a threshold voltage of the first transistor T1 by using the sensing signal. Information on the characteristic of the sub-pixel SPX may be used to convert image data so that a characteristic deviation between the sub-pixels SPX may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi (for example, the i-th control line). The first terminal thereof may be a drain electrode, and the second terminal thereof may be a source electrode.

The third transistor T3 is an initialization transistor capable of initializing the second node N2, and in case that a sensing control signal is supplied from the control line CLi, the third transistor T3 may be turned on to transmit a voltage of the initialization power source to the second node N2. Accordingly, the storage capacitor Cst electrically connected to the second node N2 may be initialized.

The storage capacitor Cst may include a lower electrode LE (or a first storage electrode) and an upper electrode UE (or a second storage electrode). The lower electrode LE may be electrically connected to the first node N1, and the upper electrode UE may be electrically connected to the second node N2. The storage capacitor Cst is charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

FIG. 3 illustrates an embodiment in which the first to third transistors T1, T2, and T3 are all N-type transistors, but the disclosure is not limited thereto. For example, at least one of the first to third transistors T1, T2, and T3 may be changed to a P-type transistor.

The structure of the pixel circuit PXC may be variously changed.

In the following embodiment, for better understanding and ease of description, a horizontal direction (an X-axis direction or a transverse direction) in a plan view is indicated as the first direction DR1, a vertical direction (a Y-axis direction or longitudinal direction) in a plan view is indicated as the second direction DR2, and a vertical direction in a cross-sectional view is indicated as the third direction DR3.

Figure 4:
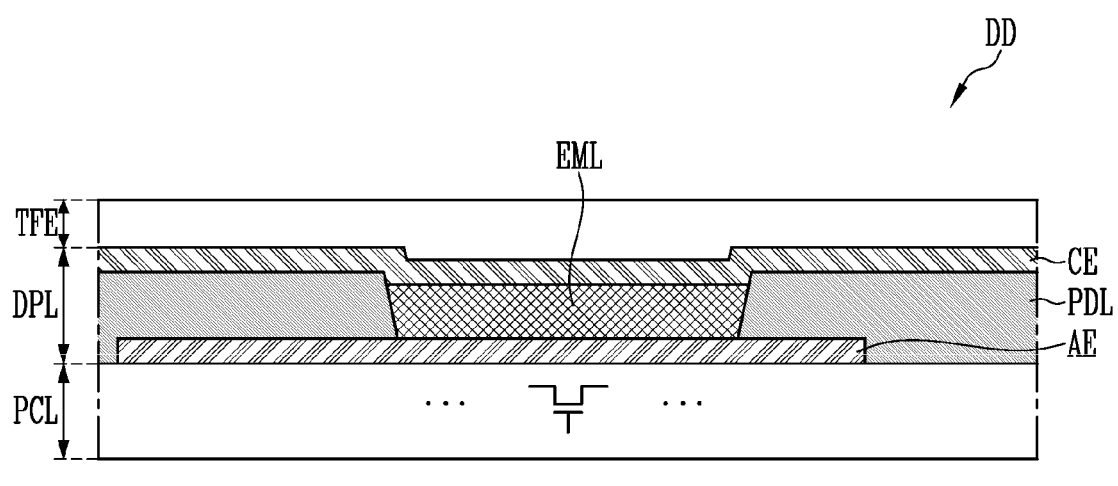
FIG. 4 illustrates a schematic cross-sectional view of a display device including a light emitting element of FIG. 3.

FIG. 4 illustrates a schematic cross-sectional view of a display device including the light emitting element of FIG. 3.

The display device DD (or the sub-pixel SPX) may include the light emitting element LD. The light emitting element LD may be provided in various shapes. In the specification, for better understanding and ease of description, an embodiment in which the light emitting elements LD are organic light emitting diodes (OLED) will be described as a reference.

Referring to FIG. 4, the display device DD may include the pixel circuit layer PCL, the display element layer DPL, and the encapsulation layer TFE.

The light emitting element LD may be disposed on the pixel circuit layer PCL. In an embodiment, the light emitting element LD may include a first electrode AE, a light emitting layer EML, and a second electrode CE. In an embodiment, the light emitting layer EML may be disposed in an area defined by a pixel defining film PDL. One surface or a surface of the light emitting layer EML may be electrically connected to the first electrode AE, and the other surface of the light emitting layer EML may be electrically connected to the second electrode CE.

The first electrode AE may be an anode electrode for the light emitting layer EML, and the second electrode CE may be a common electrode (or a cathode electrode) for the light emitting layer EML. According to the embodiment, the first electrode AE and the second electrode CE may include a conductive material. For example, the first electrode AE may include a conductive material including a reflective property, and the second electrode CE may include a transparent conductive material, but disclosure is not necessarily limited thereto.

The light emitting layer EML may have a multi-layered thin film structure including a light generation layer. The light emitting layer EML may include a hole injection layer for injecting holes, a hole transport layer for increasing chance of recombination between holes and electrons by having excellent hole transport and blocking movement of electrons that are not be combined in a light generation layer, a light generation layer that emits light by recombination of injected electrons and holes, a hole blocking layer for blocking movement of holes that are not be combined in a light generation layer, an electron transport layer for smoothly transporting electrons to the light generation layer, and an electron injection layer for injecting electrons. The light emitting layer EML may emit light based on electrical signals provided from the first electrode AE and the second electrode CE.

The pixel defining film PDL may be disposed on the pixel circuit layer PCL to define a position at which the light emitting layer EML is disposed. The pixel defining film PDL may include an organic material. In an embodiment, the pixel defining film PDL may include at least one of an acrylic resin, an epoxy resin, a phenol resin, a polyamide resin, and a polyimide resin. However, the disclosure is not limited thereto.

The encapsulation layer TFE may be disposed on the light emitting element LD (for example, the second electrode CE). The encapsulation layer TFE may offset a level difference generated by the light emitting element LD and the pixel defining layer PDL. The encapsulation layer TFE may include insulating films covering the light emitting element LD.

Figure 5:
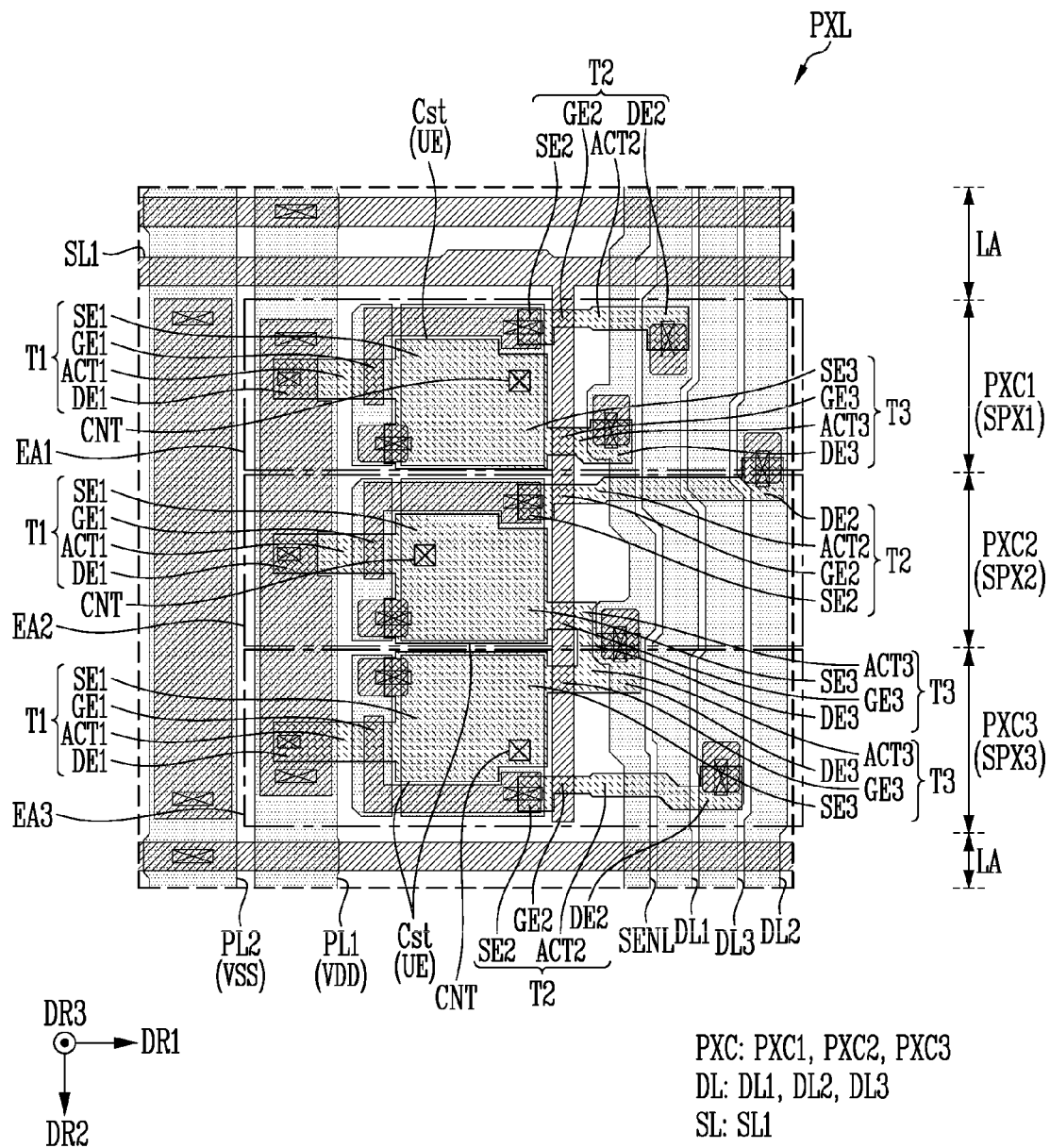
FIG. 5 illustrates a schematic top plan view of a pixel according to an embodiment.
Figure 6:
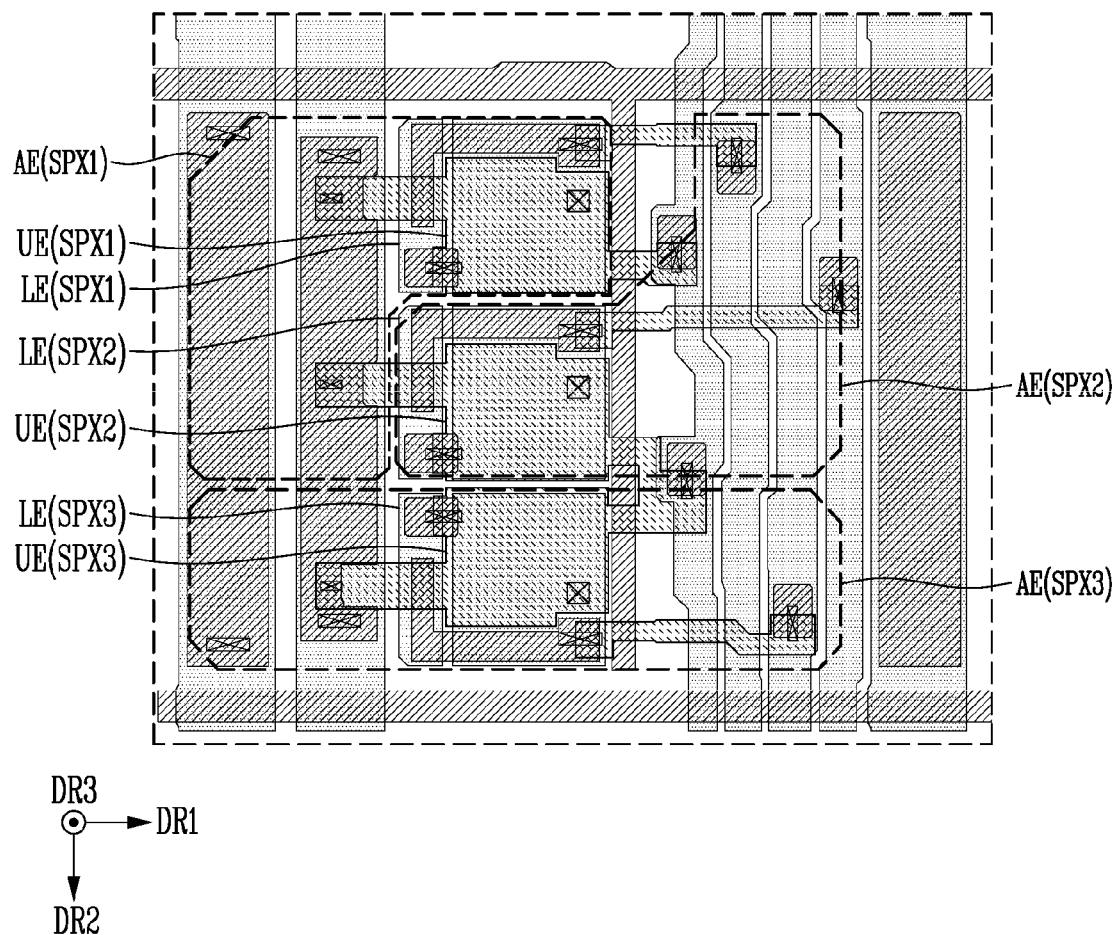
FIG. 6 illustrates a schematic top plan view of components of the pixel of FIG. 5.

FIG. 5 illustrates a schematic top plan view of a pixel according to an embodiment. FIG. 6 illustrates a schematic top plan view of components of the pixel of FIG. 5.

Referring to FIG. 5, the pixel PXL may be disposed in one area or an area of the display area (refer to "DA" in FIG. 1). The display area DA may include a wire area LA. For example, the wire area LA may be disposed between two pixels PXL disposed to be adjacent in the same pixel column. In one example, the wire area LA may be an area in which signal wires extending in the first direction DR1 are disposed.

The pixel PXL may include the first sub-pixel SPX1, the second sub-pixel SPX2, and the third sub-pixel SPX3.

The first sub-pixel SPX1, the second sub-pixel SPX2, and the third sub-pixel SPX3 may be sequentially disposed to be spaced apart from each other in the second direction DR2.

The first sub-pixel SPX1 may include a first pixel circuit PXC1 and a light emitting element LD (refer to "LD" in FIG. 3) driven by the first pixel circuit PXC1. The second sub-pixel SPX2 may include a second pixel circuit PXC2 and a light emitting element LD driven by the second pixel circuit PXC2. The third sub-pixel SPX3 may include a third pixel circuit PXC3 and a light emitting element LD driven by the third pixel circuit PXC3. Each of the first to third pixel circuits PXC1, PXC2, and PXC3 may be the pixel circuit PXC described with reference to FIG. 3.

The pixel PXL may include a first light emitting area EA1, a second light emitting area EA2, and a third light emitting area EA3.

The first light emitting area EA1 may be an area in which light is emitted from the light emitting element LD of the first sub-pixel SPX1. For example, the first light emitting area EA1 may correspond to an area in which a light emitting layer (refer to "EML" in FIG. 4) of a first light emitting element LD1 is disposed.

The second light emitting area EA2 may be an area in which light is emitted from the light emitting element LD of the second sub-pixel SPX2. For example, the second light emitting area EA2 may correspond to an area in which the light emitting layer EML of the light emitting element LD is disposed.

The third light emitting area EA3 may be an area in which light is emitted from the light emitting element LD of the third sub-pixel SPX3. For example, the third light emitting area EA3 may correspond to an area in which the light emitting layer EML of the third light emitting element LD is disposed.

Each of the first pixel circuit PXC1, the second pixel circuit PXC2, and the third pixel circuit PXC3 may include the first transistor T1, the second transistor T2, the third transistor T3, and the storage capacitor Cst.

The first transistor T1 of each of the first pixel circuit PXC1, the second pixel circuit PXC2, and the third pixel circuit PXC3 may include a first source electrode SE1, a first gate electrode GE1, a first drain electrode DE1, and a first active pattern ACT1.

The second transistor T2 of each of the first pixel circuit PXC1, the second pixel circuit PXC2, and the third pixel circuit PXC3 may include a second source electrode SE2, a second gate electrode GE2, a second drain electrode DE2, and a second active pattern ACT2.

The third transistor T3 of each of the first pixel circuit PXC1, the second pixel circuit PXC2, and the third pixel circuit PXC3 may include a third source electrode SE3, a third gate electrode GE3, a third drain electrode DE3, and a third active pattern ACT3.

Data lines DL may be disposed to extend in the second direction DR2.

The data lines DL may include a first data line DL1, a second data line DL2, and a third data line DL3.

The first data line DL1, the third data line DL3, and the second data line DL2 may be sequentially disposed to be spaced apart from each other in the first direction DR1.

The first data line DL1 is a data line for the first pixel circuit PXC1, and may be electrically connected to the second drain electrode DE2 of the second transistor T2 of the first pixel circuit PXC1. The second data line DL2 is a data line for the second pixel circuit PXC2, and may be electrically connected to the second drain electrode DE2 of the second transistor T2 of the second pixel circuit PXC2. The third data line DL3 is a data line for the third pixel circuit PXC3, and may be electrically connected to the second drain electrode DE2 of the second transistor T2 of the third pixel circuit PXC3.

A sensing line SENL may extend in the second direction DR2. The sensing line SENL may be electrically connected to the third drain electrode DE3 of the third transistor T3 of the first to third pixel circuits PXC1 to PXC3.

A scan line SL may include a first scan line SL1 extending in the first direction DR1. The first scan line SL1 may include a scan line protruding in the second direction DR2. The scan line protruding from the first scan line SL1 in the second direction DR2 may be integral with the second gate electrode GE2 of the second transistor T2 of each of the first to third pixel circuits PXC1 to PXC3. For example, a portion of the first scan line SL1 may be the second gate electrode GE2 of the second transistor T2 of each of the first to third pixel circuits PXC1 to PXC3.

The scan line protruding from the first scan line SL1 in the second direction DR2 may be integral with the third gate electrode GE3 of the third transistor T3 of each of the first to third pixel circuits PXC1 to PXC3.

The first scan line SL1 may supply a scan signal to the second gate electrode GE2 of the second transistor T2 of each of the first to third circuits PXC1 to PXC3 during a driving period of the light emitting element LD, and may supply a sensing control signal to the third gate electrode GE3 of the third transistor T3 of each of the first to third circuits PXC1 to PXC3 during a sensing period.

Referring to FIG. 5 and FIG. 6, the storage capacitor Cst may include the upper electrode UE and the lower electrode LE.

The upper electrode UE may be integral with the first source electrode SE1 of the first transistor T1 and the third source electrode SE3 of the third transistor T3. However, the disclosure is not limited thereto, and the upper electrode UE may be formed by the first active pattern ACT1 of the first transistor T1 and the third active pattern ACT3 of the third transistor T3.

The upper electrode UE and the lower electrode LE may be disposed to overlap each other when viewed in a plan view. The lower electrode LE may be formed on an electrode layer formed under or below the upper electrode UE. The lower electrode LE may have a size (or area) similar to or larger than the upper electrode UE, but is not limited thereto.

The lower electrode LE may be electrically connected to the first gate electrode GE1 and the second source electrode SE2 through a corresponding contact hole.

The first power line PL1 receiving power from the first power source VDD may extend in the second direction DR2, and may be electrically connected to the first drain electrode DE1 of the first transistor T1 of the first to third pixel circuits PXC1 to PXC3.

The second power line PL2 receiving power from the second power source VSS may extend in the first direction DR1. Although not shown in the drawing, the second power line PL2 may be electrically connected to the second electrode CE entirely disposed in an area in which the sub-pixel SPX is formed through one cathode contact portion.

The first power line PL1 and the second power line PL2 may be disposed at the left of the storage capacitor Cst.

The first gate electrode GE1 of the first transistor T1 may be electrically connected to the second source electrode SE2 of the second transistor T2. The first active pattern ACT1 may be a channel area of the first transistor T1. The first source electrode SE1 may be connected to the first active pattern ACT1. The first drain electrode DE1 may be connected to the first active pattern ACT1. The first drain electrode DE1 may be electrically connected to the first power line PL1 through a corresponding contact hole.

The first gate electrode GE1 may surround at least a portion of the storage capacitor Cst when viewed in a plan view. The first gate electrode GE1 may include a portion bent to surround at least a portion of the storage capacitor Cst.

As a portion of the first gate electrode GE1 exposed within a limited space and/or a size of the first gate electrode GE1 increases, a size of the storage capacitor Cst decreases, and capacitance of the storage capacitor Cst also decreases. Therefore, as the size of the first gate electrode GE1 increases, the capacitance of the storage capacitor Cst decreases, and thus the reliability of the storage capacitor Cst decreases.

In the first to third pixel circuits PXC1 to PXC3, the first source electrode SE1, the third source electrode SE3, and the upper electrode UE may be electrically connected to the first electrode (see "AE" in FIG. 3) through a contact portion CNT.

The second gate electrode GE2 of the second transistor T2 may be integral with the first scan line SL1, and may overlap the second active pattern ACT2. The second active pattern ACT2 may be a channel area of the second transistor T2. The second source electrode SE2 may be connected to the second active pattern ACT2. The second source electrode SE2 may be connected to the first gate electrode GE1. The second drain electrode DE2 may be connected to the second active pattern ACT2. The second drain electrode DE2 may electrically be connected to the data lines DL through a corresponding contact hole.

The third gate electrode GE3 may be integral with the first scan line SL1, and may overlap the third active pattern ACT3. The third active pattern ACT3 may be a channel area of the third transistor T3. The third source electrode SE3 may be connected to the third active pattern ACT3. The third source electrode SE3 may be electrically connected to the sensing line SENL through a corresponding contact hole.

Figure 7:
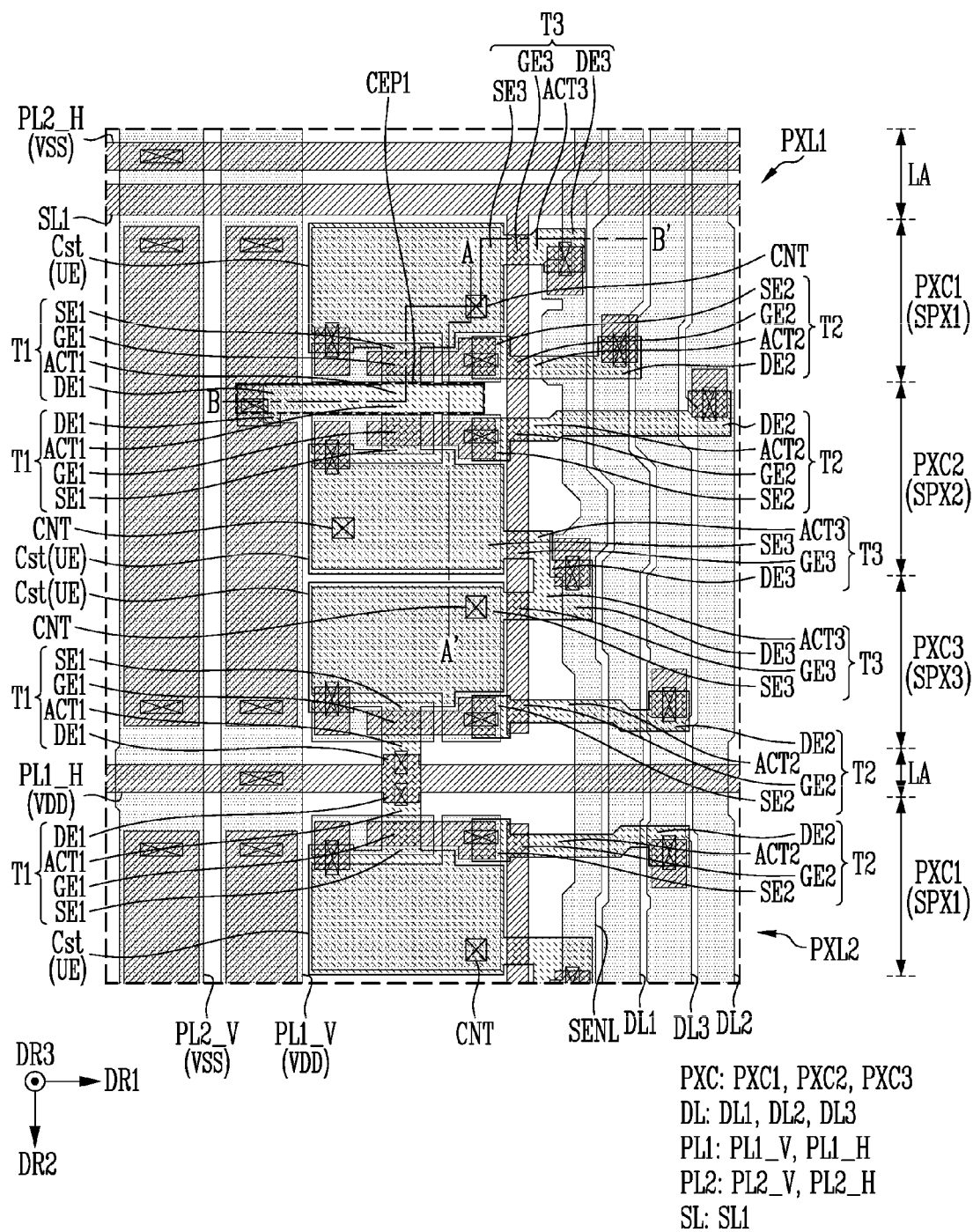
FIG. 7 illustrates a schematic top plan view of an example of a first pixel of FIG. 1.

FIG. 7 illustrates a schematic top plan view of an example of the first pixel of FIG. 1.

Figure 8:
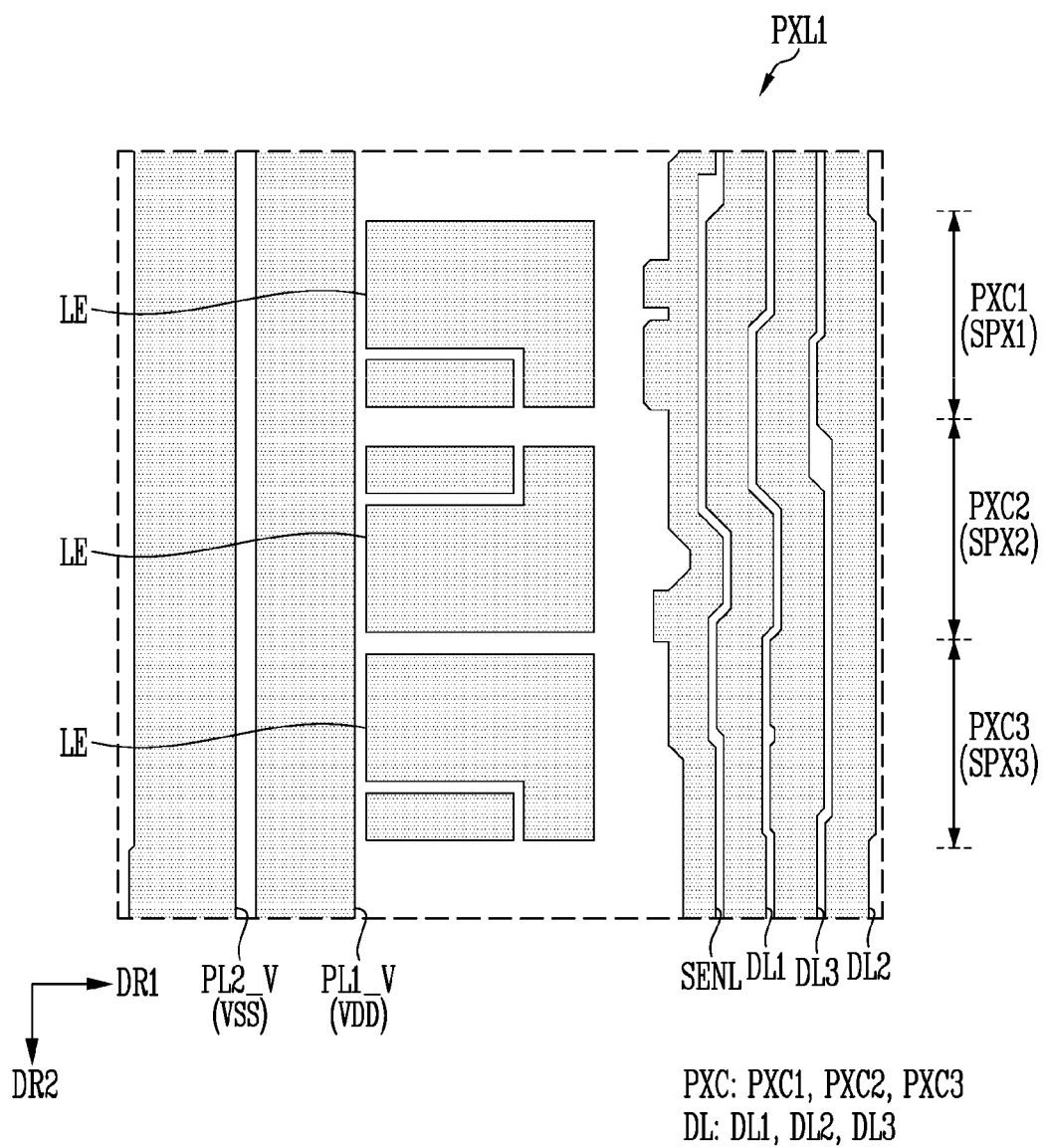
FIG. 8 illustrates a schematic top plan view of components of the first pixel of FIG. 7.
Figure 9:
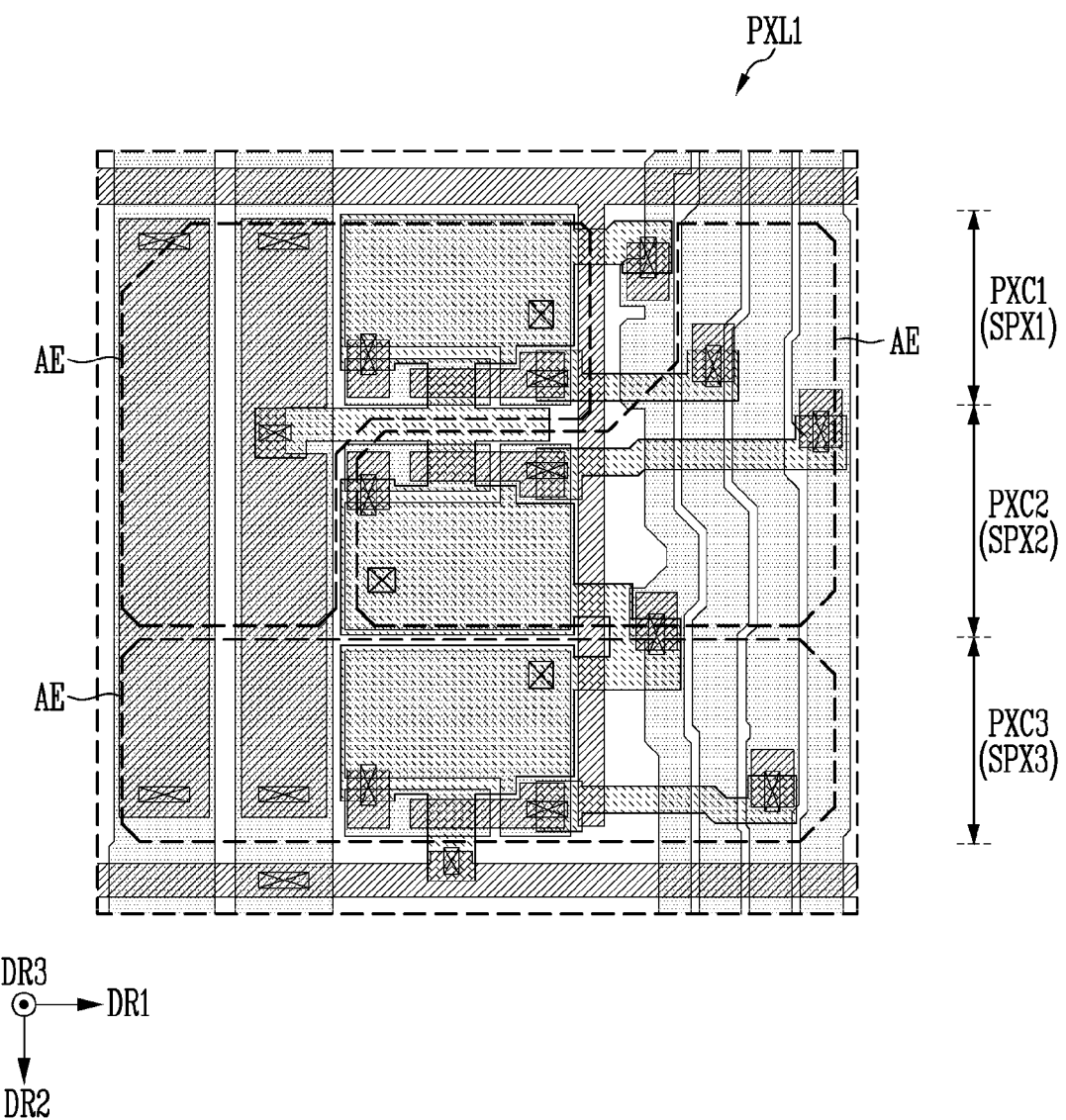
FIG. 9 illustrates a schematic top plan view of disposition of electrodes of a pixel of FIG. 7.

FIG. 8 illustrates a schematic top plan view of components of the first pixel of FIG. 7. FIG. 9 illustrates a schematic top plan view of disposition of electrodes of the pixel of FIG. 7. FIG. 8 is a schematic top plan view of only the configuration of the pixel electrodes of FIG. 7 disposed in the same conductive layer. FIG. 9 is a drawing for explaining the disposition of the first electrode AE of the light emitting element LD.

In relation to the embodiments of FIG. 7 to FIG. 9, in order to avoid redundant description, in order to avoid redundant descriptions, differences from the above-described embodiment (for example, the embodiment of FIG. 5 and FIG. 6) will be described.

FIG. 7 shows first and second pixels PXL1 and PXL2 included in the display device (refer to "DD" in FIG. 1) and continuously disposed.

The first pixel PXL1 and the second pixel PXL2 may be sequentially disposed in the second direction DR2. Each of the first pixel PXL1 and the second pixel PXL2 may include the first to third sub-pixels SPX1 to SPX3.

The first sub-pixel SPX1, the second sub-pixel SPX2, and the third sub-pixel SPX3 may be sequentially disposed to be spaced apart from each other in the second direction DR2. In one example, the third sub-pixel SPX3 of the first pixel PXL1 may be disposed to be spaced apart from the first sub-pixel SPX1 of the second pixel PXL2 in the second direction DR2.

The first to third sub-pixels SPX1, SPX2, and SPX3 included in the first and second pixels PXL1 and PXL2 may emit light in different colors. For example, the first sub-pixel SPX1 included in the first and second pixels PXL1 and PXL2 may be a red sub-pixel, the second sub-pixel SPX2 may be a blue sub-pixel, and the third sub-pixel SPX3 may be a green sub-pixel.

The display device DD may include the first power line PL1 and the second power line PL2. The first power line PL1 is a wire that receives power from the first power source VDD, and may include a first vertical power line PL1_V and a first horizontal power line PL1_H. The second power line PL2 is a wire that receives power from the second power source VSS, and may include a second vertical power line PL2_V and a second horizontal power line PL2_H.

The first vertical power line PL1_V and the second vertical power line PL2_V may be disposed at the left of the storage capacitor Cst.

The first horizontal power line PL1_H may be disposed in the wire area LA between the first pixel PXL1 and the second pixel PXL2. In one example, the first horizontal power line PL1_H may extend and be disposed between the third sub-pixel SPX3 of the first pixel PXL1 and the first sub-pixel SPX1 of the second pixel PXL2 in the first direction DR1.

The second horizontal power line PL2_H may be disposed at an upper side of the first scan line SL1 when viewed in a plan view. In one example, the first scan line SL1 may be disposed between the second horizontal power line PL2_H and the first sub-pixel SPX1 of the first pixel PXL1.

The first pixel PXL1 may include a first common pattern CEP1. The first common pattern CEP1 may extend in the first direction DR1 to be disposed between the first sub-pixel SPX1 and the second sub-pixel SPX2.

The first sub-pixel SPX1 and the second sub-pixel SPX2 may be electrically connected to the first vertical power line PL1_V by sharing the first common pattern CEP1.

The first sub-pixel SPX1 and the second sub-pixel SPX2 of the first pixel PXL1 may share the first drain electrode DE1 and the first common pattern CEP1. For example, the first common pattern CEP1 may form the first active pattern ACT1 of the first sub-pixel SPX1 and the first active pattern ACT1 of the second sub-pixel SPX2.

The first source electrode SE1 of the first sub-pixel SPX1 of the first pixel PXL1 and the first source electrode SE1 of the second sub-pixel SPX2 may be separate electrodes branched from the first common pattern CEP1. The first source electrode SE1 of the first sub-pixel SPX1 and the first source electrode SE1 of the second sub-pixel SPX2 may be electrically connected to the first common electrode CEP1.

The first common pattern CEP1 may be disposed under or below the first gate electrode GE1 of the first sub-pixel SPX1 and the first gate electrode GE1 of the second sub-pixel SPX2 to overlap the first gate electrode GE1 of the first sub-pixel SPX1 and the first gate electrode GE1 of the second sub-pixel SPX2.

The first common pattern CEP1 may form a channel area of the first transistor T1 of each of the first sub-pixel SPX1 and the second sub-pixel SPX2. The first common pattern CEP1 may be a conductive pattern doped with an N+ type.

The first common pattern CEP1 may include a shape that extends from the first vertical power line PL1_V to a space between the first sub-pixel SPX1 and the second sub-pixel SPX2 to be branched in both directions in which the first sub-pixel SPX1 and the second sub-pixel SPX2 are disposed. For example, the first common pattern CEP1 may be a cross shape (+) or a shape (⊢) in which the English letter T is rotated 90 degrees to the right.

The first gate electrode GE1 may be electrically connected to the second source electrode SE2 of the second transistor T2.

The third sub-pixel SPX3 of the first pixel PXL1 and the first sub-pixel SPX1 of the second pixel PXL2 may share the first horizontal power line PL1_H.

The third sub-pixel SPX3 of the first pixel PXL1 and the first sub-pixel SPX1 of the second pixel PXL2 may be electrically connected to the first horizontal power line PL1_H disposed between the first pixel PXL1 and the second pixel PXL2. Accordingly, the first gate electrode GE1 of the third sub-pixel SPX3 of the first pixel PXL1 may have the same size as the first gate electrode GE1 of the first sub-pixel SPX1 and the second sub-pixel SPX2 of the first pixel PXL1.

The third sub-pixel SPX3 of the first pixel PXL1 may be electrically connected to the first horizontal power line PL1_H through a contact hole corresponding to the first drain electrode DE1. The first sub-pixel SPX1 of the second pixel PXL2 may be electrically connected to the first horizontal power line PL1_H through a contact hole corresponding to the first drain electrode DE1.

In the disclosure, the first sub-pixel SPX1 and the second sub-pixel SPX2 may be electrically connected to the first vertical power line PL1_V by sharing the first common pattern CEP1 disposed between the first sub-pixel SPX1 and the second sub-pixel SPX2, and the third sub-pixel SPX3 may be electrically connected to the first horizontal power line PL1_H together with the first sub-pixel SPX1 of the adjacent pixel (for example, the second pixel PXL2). Accordingly, a size of the first gate electrode GE1 of each of the first to third sub-pixels SPX1 to SPX3 may be relatively minimized or reduced.

The second pixel PXL2 may be symmetrical to the first pixel PXL1 with respect to the first direction DR1. In this regard, it will be described with reference to FIG. 12.

Figure 10:
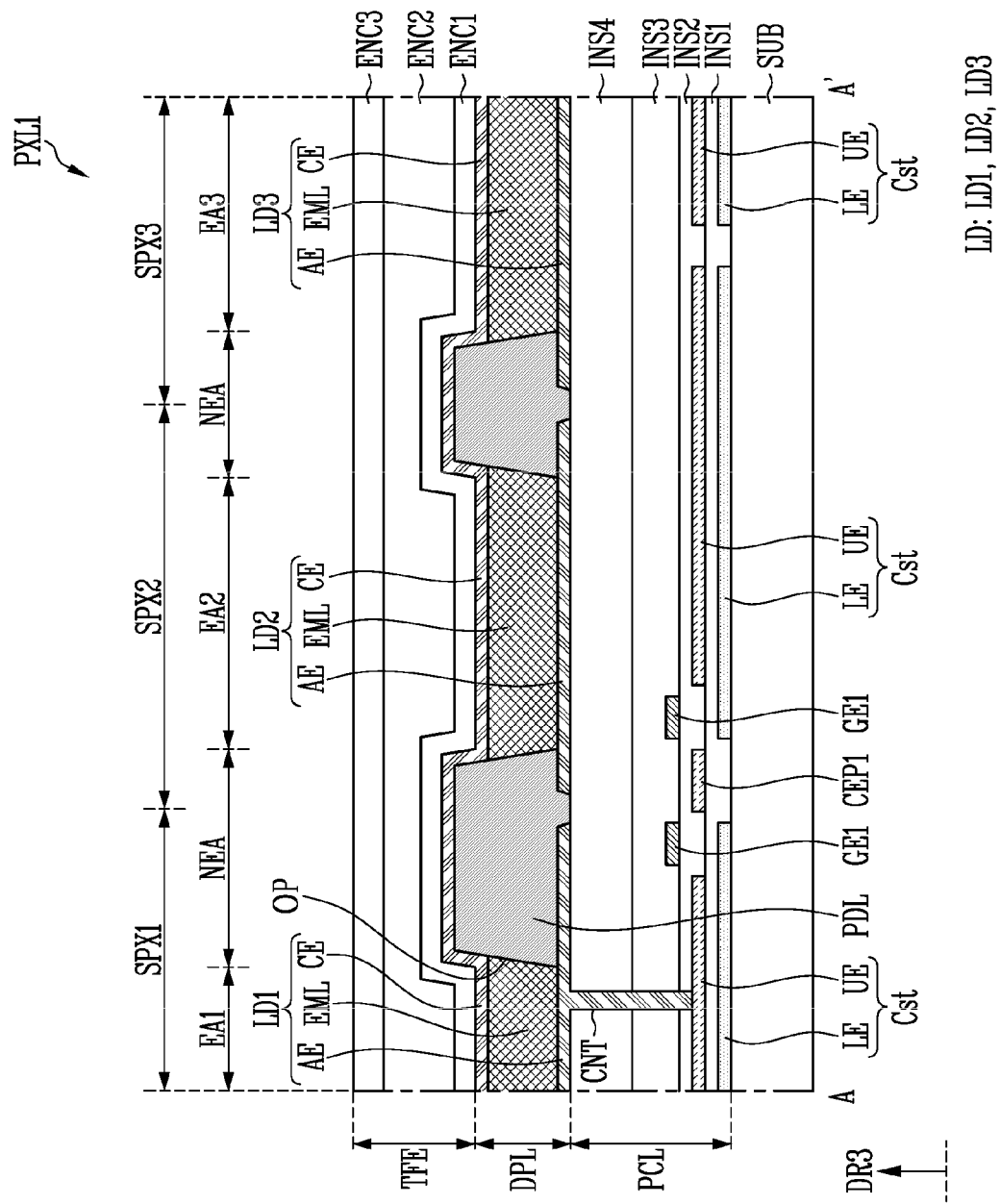
FIG. 10 illustrates a schematic cross-sectional view taken along line A-A' of FIG. 7.
Figure 11:
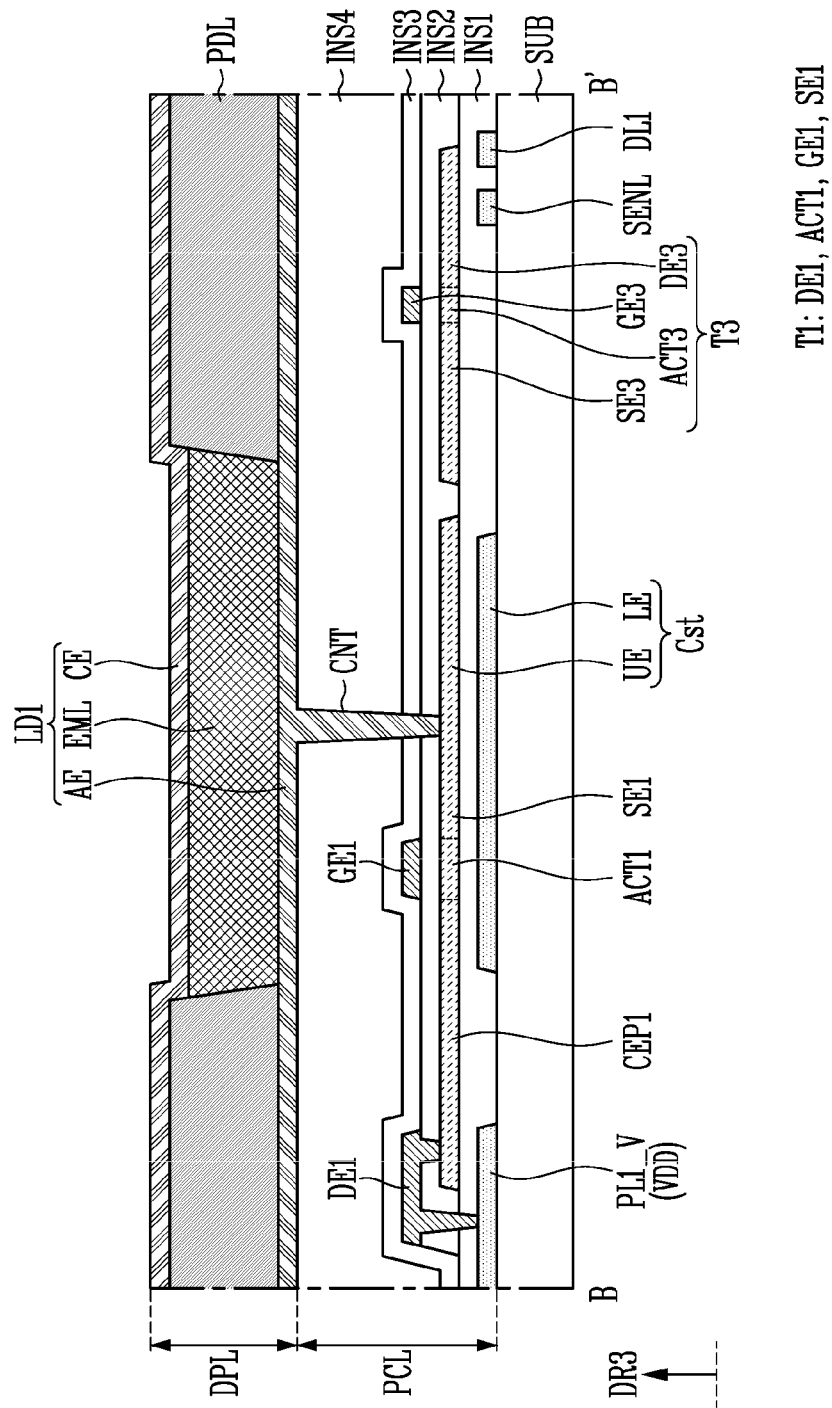
FIG. 11 illustrates a schematic cross-sectional view taken along line B-B' of FIG. 7.

FIG. 10 illustrates a schematic cross-sectional view taken along line A-A' of FIG. 7. FIG. 11 illustrates a schematic cross-sectional view taken along line B-B' of FIG. 7.

Referring to FIG. 10 and FIG. 11, the stacked structure of the pixel PXL is simplified and shown, such as showing each electrode only as an electrode of a single film, and each insulating layer only as an insulating layer of a single film, but is not limited thereto.

In relation to the embodiments of FIG. 10 and FIG. 11, differences from the above-described embodiment will be described in order to avoid duplicate description.

Referring to FIG. 1 to FIG. 4 and FIG. 7 to FIG. 11, the first pixel PXL1 may include the first sub-pixel SPX1, the second sub-pixel SPX2, and the third sub-pixel SPX3 that are adjacent to each other.

The first sub-pixel SPX1 may include a first light emitting area EA1 and a non-light emitting area NEA surrounding the first light emitting area EA1. The second sub-pixel SPX2 may include a second light emitting area EA2 and a non-light emitting area NEA surrounding the second light emitting area EA2. The third sub-pixel SPX3 may include a third light emitting area EA3 and a non-light emitting area NEA surrounding the third light emitting area EA3.

Each of the first to third sub-pixels SPX1, SPX2, and SPX3 may include the substrate SUB, the pixel circuit layer PCL, the display element layer DPL, and the encapsulation layer TFE.

The substrate SUB may include a transparent insulating material to transmit light. The substrate SUB may be a rigid substrate or a flexible substrate.

In the pixel circuit layer PCL, circuit elements (for example, the first to third transistors T1, T2, and T3) and signal wires electrically connected to the circuit elements may be disposed. In the display element layer DPL, the light emitting element (refer to "LD" in FIG. 3) electrically connected to the circuit elements of each of the first to third sub-pixels SPX1, SPX2, and SPX3 may be disposed.

At least one or more insulating layers may be disposed on the substrate SUB. For example, a first insulating layer INS1, the second insulating layer INS2, a third insulating layer INS3, and a fourth insulating layer INS4 may be sequentially stacked each other on the substrate SUB along the third direction DR3. At least one conductive layer may be disposed on the substrate SUB. For example, the conductive layer may include a first conductive layer disposed between the substrate SUB and the first insulating layer INS1, a second conductive layer disposed on the second insulating layer INS2, a third conductive layer disposed on the third insulating layer INS3, and a fourth conductive layer disposed on the fourth insulating layer INS4.

The first conductive layer may include the first vertical power line PL1_V, the second vertical power line PL2_V, the sensing line SENL, the data lines DL, and the lower electrode LE of the storage capacitor Cst.

The second conductive layer may include the first horizontal power line PL1_H, the second horizontal power line PL2_H, and the first common pattern CEP1.

The third conductive layer may include the first drain electrode DE1 and the first to third gate electrodes GE1 to GE3.

The fourth conductive layer may include the first electrode AE.

The pixel circuit layer PCL may be disposed on the substrate SUB. The above-described first to fourth insulating layers INS1, INS2, INS3, and INS4 may be disposed on the pixel circuit layer PCL.

The first insulating layer INS1 (or a buffer layer) may be entirely disposed on the substrate SUB. The first insulating layer INS1 may prevent impurities from spreading into the first to third transistors T1 to T3. The first insulating layer INS1 may be an inorganic insulating film including an inorganic material. The first insulating layer INS1 may include at least one of a silicon nitride ($SiN_x$), a silicon oxide ($SiO_x$), and a silicon oxynitride ($SiO_xN_y$), or may include at least one of metal oxides such as an aluminum oxide ($Al_xO_y$). The first insulating layer INS1 may be provided as a single film, and may be provided as a multi-film of at least two or more films. In case that the first insulating layer INS1 is provided as the multi-film, respective layers thereof may be made of the same material or different materials. The first insulating layer INS1 may be omitted depending on the material, a process condition, and the like of the substrate SUB.

The second insulating layer INS2 (or the active layer) may be entirely disposed on the first insulating layer INS1. The second insulating layer INS2 may include the same material or a different material as the first insulating layer INS1 described above, or may include a material suitable (or selected) from materials as constituent materials of the first insulating layer INS1. For example, the second insulating layer INS2 may include an inorganic insulating film including an inorganic material.

The third insulating layer INS3 (or the gate insulating layer) may be entirely provided and/or formed on the second insulating layer INS2. The third insulating layer INS3 may include a same material or a similar material as the first insulating layer INS1, or may include one or more materials suitable (or selected) from materials as constituent materials of the first insulating layer INS1. For example, the third insulating layer INS3 may be an inorganic insulating film including an inorganic material. The third insulating layer INS3, as shown in FIG. 10, may be partially disposed on the second insulating layer INS2. For example, the second insulating layer INS2 may be etched together with a base material of the second conductive layer during a manufacturing process of the second conductive layer so that the second insulating layer INS2 is disposed only under or below the second conductive layer. The second insulating layer INS2 may have the same width as the second conductive layer disposed thereon, but is not limited thereto.

The fourth insulating layer INS4 (or a via layer) may be entirely provided and/or formed on the third insulating layer INS3. The fourth insulating layer INS4 may be an inorganic insulating film including an inorganic material or an organic insulating film including an organic material. The inorganic insulating film may include, for example, at least one of a silicon oxide ($SiO_x$), a silicon nitride ($SiN_x$), a silicon oxynitride ($SiO_xN_y$), an aluminum oxide ($Al_xO_y$). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin. In the embodiment, the fourth insulating layer INS4 may be an organic insulating film including an organic material.

Each of the aforementioned second to fourth insulating layers INS2 to INS4 may be partially opened to include the contact portion CNT (or contact hole). The contact portion CNT may be a connection point for electrically connecting each of the first to third pixel circuits PXC1 to PXC3 and the light emitting element LD of each of the first to third sub-pixels SPX1 to SPX3.

The first transistor T1 may include the first active pattern ACT1 disposed on the second insulating layer INS2, the first source electrode SE1, and the first drain electrode DE1 and the first gate electrode GE1 disposed on the third insulating layer INS3.

A lower metal pattern may be disposed under or below the first transistor T1. The lower metal pattern may be the first conductive layer disposed between the substrate SUB and the first insulating layer INS1, and may be integral with the lower electrode LE.

The second transistor T2 may include the second active pattern ACT2 disposed on the second insulating layer INS2, the second source electrode SE2, the second drain electrode DE2, and the second gate electrode GE2 disposed on the third insulating layer INS3.

The third transistor T3 may include the third active pattern ACT3 disposed on the second insulating layer INS2, the third source electrode SE3, the third drain electrode DE3, and the third gate electrode GE3 disposed on the third insulating layer INS3.

The storage capacitor Cst may include the lower electrode LE disposed between the substrate SUB and the first insulating layer INS1 and the upper electrode UE overlapping the lower electrode LE with the first insulating layer INS1 interposed therebetween. The lower electrode LE may be the first conductive layer, and the upper electrode UE may be a semiconductor pattern disposed between the first insulating layer INS1 and the second insulating layer INS2 and doped with impurities to have conductivity. In the first to third sub-pixels SPX1 to SPX3, the lower electrode LE may be integral with the lower metal pattern, and the upper electrode UE may be integral with the first source electrode SE1 and the third source electrode SE3. The upper electrode UE may be electrically connected to some or a number of constituent elements of the display element layer DPL, for example, the first electrode AE, through the corresponding contact portion CNT.

The display element layer DPL may be provided and/or formed on the fourth insulating layer INS4.

The display element layer DPL may include the first light emitting element LD1, the second light emitting element LD2, the third light emitting element LD3, and the pixel defining film PDL. The first light emitting element LD1 may be disposed on the display element layer DPL of the first sub-pixel SPX1, and may be electrically connected to the first pixel circuit PXC1. The second light emitting element LD2 may be disposed on the display element layer DPL of the second sub-pixel SPX2, and may be electrically connected to the second pixel circuit PXC2. The third light emitting element LD3 may be disposed on the display element layer DPL of the third sub-pixel SPX3, and may be electrically connected to the third pixel circuit PXC3. Each of the first to third light emitting elements LD1, LD2, and LD3 may be the light emitting element LD described with reference to FIG. 3.

The first electrode AE may be electrically connected to the upper electrode UE of the first storage capacitor Cst through the contact portion CNT.

The first electrode AE may be made of a conductive material (or substance). The conductive material may include an opaque metal. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the first electrode AE is not limited to the above-described embodiment. In an embodiment, the first electrode AE may also include a transparent conductive material (or substance). The transparent conductive material (or substance) may include a conductive oxide such as an indium tin oxide (ITO), an indium zinc oxide (IZO), a zinc oxide ($ZnO_x$), an indium gallium zinc oxide (IGZO), and an indium tin zinc oxide (ITZO), and a conductive polymer such as poly(3,4-ethylenedioxythiophene) (PEDOT). In case that the first electrode AE may include a transparent conductive material (or substance), a separate conductive layer made of an opaque metal for reflecting light emitted from the light emitting layer EML in the image display direction of the display device DD (or the upper direction of the encapsulation layer TFE) may be added.

The pixel defining film PDL may define (or partition) the first light emitting area EA1, the second light emitting area EA2, and the third light emitting area EA3. The pixel defining film PDL may include an organic insulating film made of an organic material. The organic material may include an acryl resin, an epoxy resin, a phenolic resin, a polyamide resin, a polyimide resin, or the like within the spirit and the scope of the disclosure. In an embodiment, the pixel defining film PDL may include a light absorbing material, or may serve to absorb light introduced from the outside by a light absorbing agent being applied thereon. For example, the pixel defining film PDL may include a carbon-based black pigment, but is not limited thereto.

The pixel defining film PDL may be partially opened to include an opening exposing one area or an area of the first electrode AE, and may protrude from the fourth insulating layer INS4 in the third direction DR3 along a circumference of each of the first to third light emitting areas EA1, EA2, and EA3.

The second electrode CE may be a common layer commonly provided to the first sub-pixel SPX1, the second sub-pixel SPX2, and the third sub-pixel SPX3. The second electrode CE may be provided in a plate shape in the entire area of the display area DA, but is not limited thereto.

Although not directly shown in the drawing, the second electrode CE may be electrically connected to the second power line PL2.

The encapsulation layer TFE may be entirely provided and/or formed on the second electrode CE.

The encapsulation layer TFE may include a first encapsulation layer ENC1, a second encapsulation layer ENC2, and a third encapsulation layer ENC3 sequentially disposed on the second electrode CE. The first encapsulation layer ENC1 may be formed on the display element layer DPL (or the second electrode CE), and may be disposed in at least a portion of the display area DA and the non-display area NDA. The second encapsulation layer ENC2 may be formed on the first encapsulation layer ENC1, and may be disposed in at least a portion of the display area DA and the non-display area NDA. The third encapsulation layer ENC3 may be formed on the second encapsulation layer ENC2, and may be disposed in at least a portion of the display area DA and the non-display area NDA. In an embodiment, the third encapsulation layer ENC3 may be disposed throughout the display area DA and the non-display area NDA.

Each of the first and third encapsulation layers ENC1 and ENC3 may be formed of an inorganic film including an inorganic material, and the second encapsulation layer ENC2 may be formed of an organic film including an organic material.

In an embodiment, a color filter layer and/or a color conversion layer for emitting light emitted from the first to third light emitting elements LD1, LD2, and LD3 as light having excellent color reproducibility may be selectively provided and/or formed on the encapsulation layer TFE.

Figure 12:
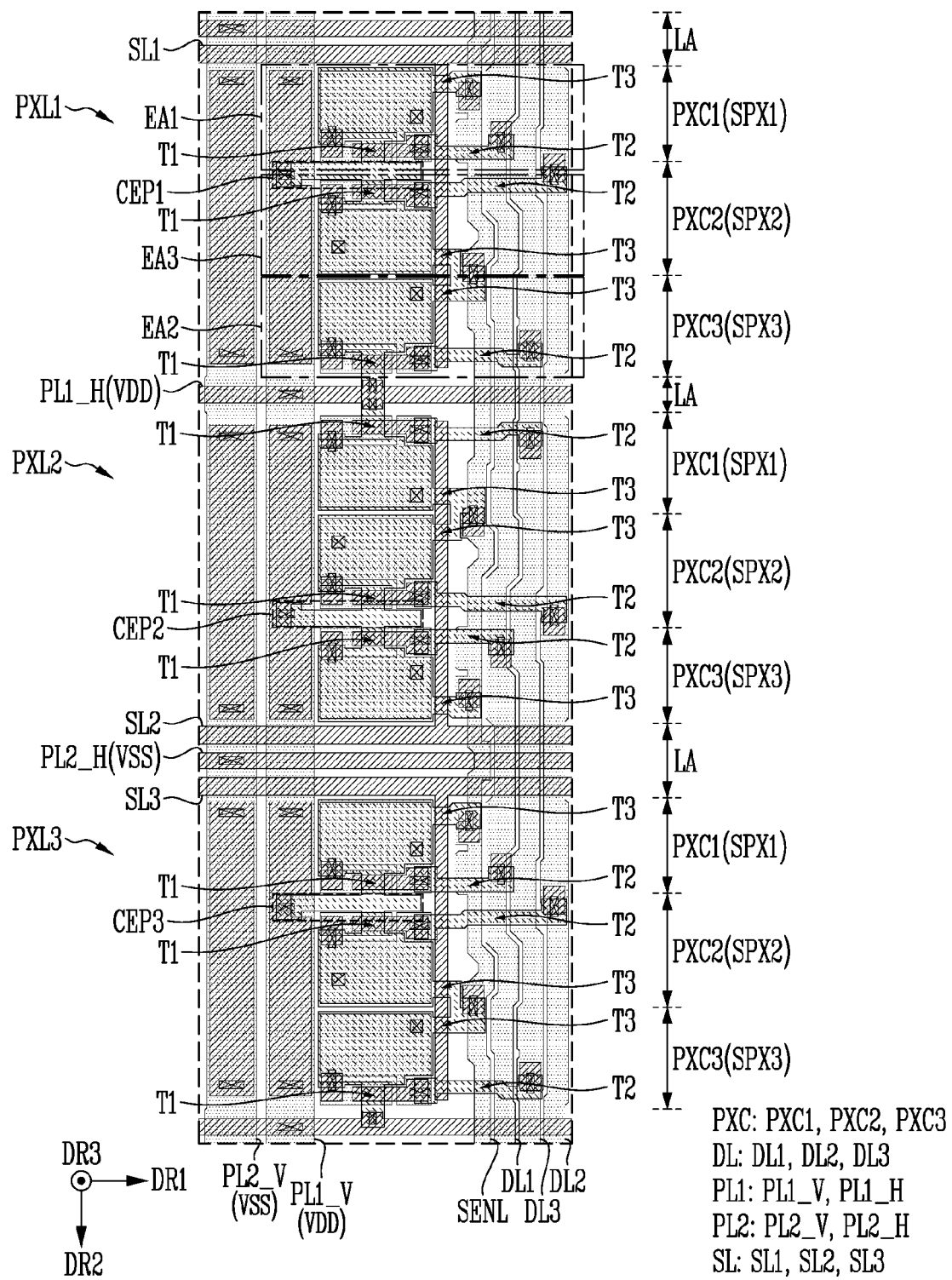
FIG. 12 illustrates a schematic top plan view of an example of a first pixel to a third pixel of FIG. 1.

FIG. 12 illustrates a schematic top plan view of an example of the first pixel to the third pixel of FIG. 1.

Referring to FIG. 12, the first to third pixels PXL1 to PXL3 may be sequentially disposed in second direction DR2. The first pixel PXL1, the second pixel PXL2, and the third pixel PXL3 may be disposed to be spaced apart from each other.

The first pixel PXL1 and the second pixel PXL2 of FIG. 12 may respectively correspond to the first pixel PXL1 and the second pixel PXL2 of FIG. 7.

In the embodiment, the second pixel PXL2 may be symmetrical to the first pixel PXL1 with respect to the first direction DR1.

The first pixel PXL1 may include the first common pattern CEP1. The second pixel PXL2 may include a second common pattern CEP2. The first common pattern CEP1 may extend in the first direction DR1 to be disposed between the first sub-pixel SPX1 and the second sub-pixel SPX2 of the first pixel PXL1. The second common pattern CEP2 may extend in the first direction DR1 to be disposed between the second sub-pixel SPX2 and the third sub-pixel SPX3 of the second pixel PXL2.

The first sub-pixel SPX1 and the second sub-pixel SPX2 of the first pixel PXL1 may be electrically connected to the first vertical power line PL1_V by sharing the first common pattern CEP1.

The second sub-pixel SPX2 and the third sub-pixel SPX3 of the second pixel PXL2 may be electrically connected to the first vertical power line PL1_V by sharing the second common pattern CEP2.

The third sub-pixel SPX3 of the first pixel PXL1 and the first sub-pixel SPX1 of the second pixel PXL2 may be electrically connected to the first horizontal power line PL1_H disposed between the first pixel PXL1 and the second pixel PXL2.

In the embodiment, the first horizontal power line PL1_H may be disposed between the third sub-pixel SPX3 of the first pixel PXL1 and the first sub-pixel SPX1 of the second pixel PXL2 to extend in the first direction DR1.

In the embodiment, the second pixel PXL2 may be symmetrical to the third pixel PXL3 with respect to the first direction DR1. For example, the third pixel PXL3 may have the same structure as the first pixel PXL1.

The third pixel PXL3 may include a third common pattern CEP3. The third common pattern CEP3 may extend in the first direction DR1 to be disposed between the first sub-pixel SPX1 and the second sub-pixel SPX2 of the third pixel PXL3.

The first to third sub-pixels SPX1 to SPX3 of the third pixel PXL3 may have substantially similar or identical structures to the first to third sub-pixels SPX1 to SPX3 of the first pixel PXL1. For example, the third common pattern CEP3 of the third pixel PXL3 may have the same physical and electrical connection relationship as the first common pattern CEP1 of the first pixel PXL1.

A second scan line SL2, a second horizontal power line PL2_H, and a third scan line SL3 may be disposed in the wire area LA between the second pixel PXL2 and the third pixel PXL3.

The second scan line SL2, the third scan line SL3, and the second horizontal power line PL2_H may be disposed to extend in the first direction DR1.

The second horizontal power line PL2_H may be disposed between the second scan line SL2 and the third scan line SL3 to extend in the first direction DR1. The second scan line SL2 may be disposed to be spaced apart from the third sub-pixel SPX3 of the second pixel PXL2 in the second direction DR2. The first sub-pixel SPX1 of the third pixel PXL3 may be disposed to be space apart from the third scan line SL3 in the second direction DR2.

In the embodiment, the first horizontal power line PL1_H is connected to the first vertical power line PL1_V through a contact hole, but may be a conductive pattern disposed on a different layer. The second horizontal power line PL2_H is connected to the second vertical power line PL2_V through a contact hole, but may be a conductive pattern disposed on a different layer.

As the second horizontal power line PL2_H is disposed between the second scan line SL2 and the third scan line SL3, a conduction path to which the second power source VSS is applied by the second horizontal power line PL2_H may be covered by the second scan line SL2 and the third scan line SL3. Experimentally, in case that the conductive path to which the second power source VSS is applied through the second horizontal power line PL2_H is directly adjacent to the conductive path to which the gate signal of the first transistor T1 is applied, there is a risk of formation of coupling capacitance between both electrodes. According to an embodiment, as the conductive path to which the second power source VSS is applied through the second horizontal power line PL2_H is covered by the second scan line SL2 and the third scan line SL3, coupling capacitance between the first gate electrode GE1 of the third sub-pixel SPX3 and the second horizontal power line PL2_H may be minimized (or improved).

Figure 13:
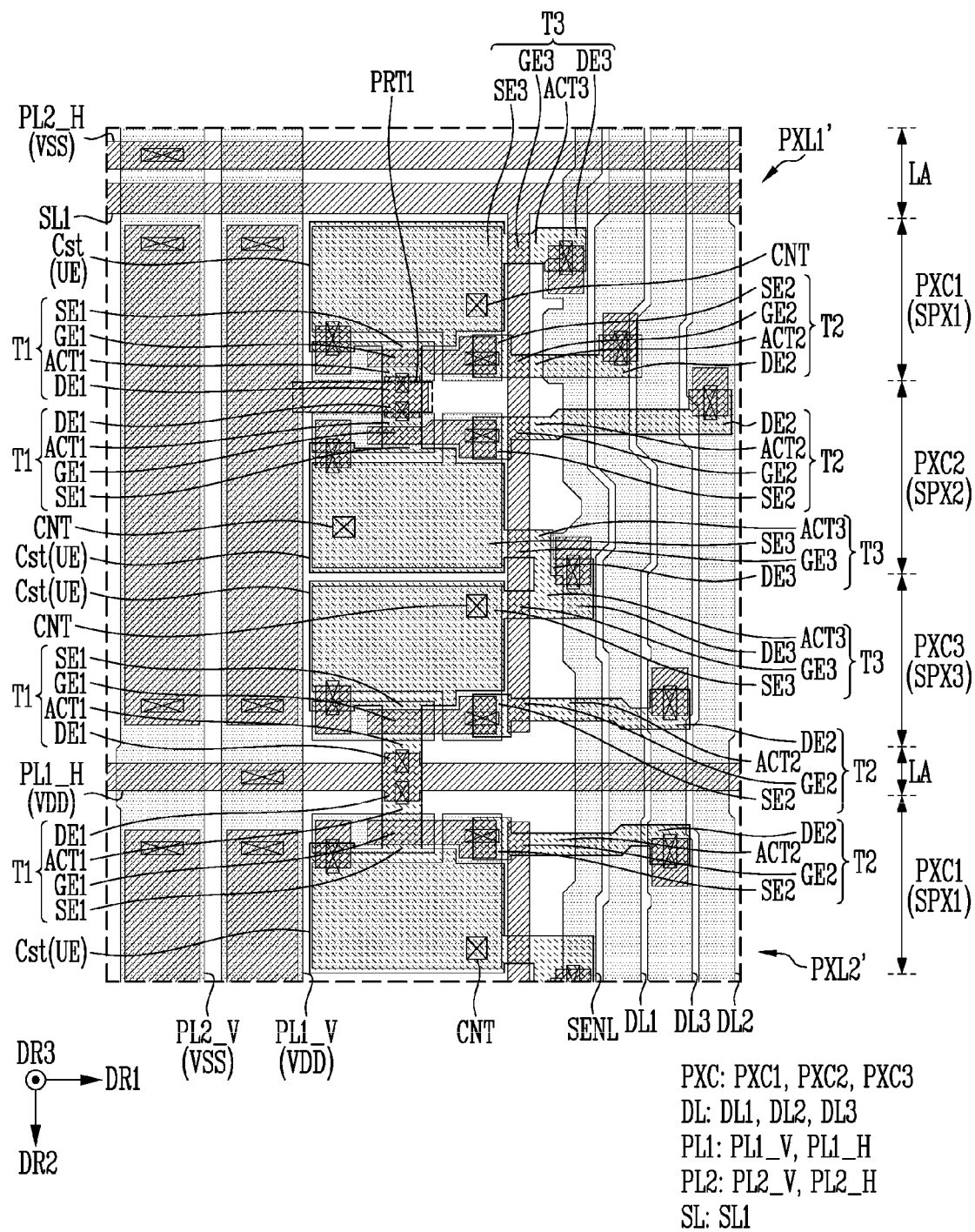
FIG. 13 illustrates a schematic top plan view of another example of a first pixel of FIG. 1.

FIG. 13 illustrates a schematic top plan view of another example of the first pixel of FIG. 1.

In relation to the embodiment of FIG. 8, in order to avoid redundant description, in order to avoid redundant descriptions, differences from the above-described embodiment (for example, the embodiment of FIG. 5 to FIG. 7) will be described.

FIG. 8 shows consecutive first and second pixels PXL1' and PXL2' included in the display device (refer to "DD" in FIG. 1).

The display device may include the first pixel PXL1' and the second pixel PXL2'. Each of the first pixel PXL1' and the second pixel PXL2' may include the first to third sub-pixels SPX1 to SPX3.

The first pixel PXL1' may include a first protruding pattern PRT1. The first protruding pattern PRT1 may be an electrode protruding in the first direction DR1 from the first vertical power line PL1_V disposed in an area corresponding to the first pixel PXL1'.

The first protruding pattern PRT1 may be an electrode extending from the first vertical power line PL1_V between the first sub-pixel SPX1 and the second sub-pixel SPX2 of the first pixel PXL1. In one example, the first protruding pattern PRT1 may be integral with the first vertical power line PL1_V. The first protruding pattern PRT1 may be disposed on the same conductive layer as the first vertical power line PL1_V.

The first protruding pattern PRT1 may be disposed between the first sub-pixel SPX1 and the second sub-pixel SPX2 of the first pixel PXL1. The first sub-pixel SPX1 and the second sub-pixel SPX2 of the first pixel PXL1 may be electrically connected to the first vertical power line PL1_V through the first protruding pattern PRT1.

The first gate electrode GE1 of the first sub-pixel SPX1 and the first gate electrode GE1 of the second sub-pixel SPX2 may directly contact the first protruding pattern PRT1.

In the embodiment, as the first protruding pattern PRT1 extends from the first vertical power line PL1_V to a space between the first sub-pixel SPX1 and the second sub-pixel SPX2, a size of the first transistor T1 may be reduced. For example, reliability of the display device may be secured by securing the capacitance of the storage capacitor Cst by minimizing or reducing the size of the first gate electrode GE1 for receiving the gate signal.

The third sub-pixel SPX3 of the first pixel PXL1' and the first sub-pixel SPX1 of the second pixel PXL2' may be electrically connected to the first horizontal power line PL1_H. The third sub-pixel SPX3 of the first pixel PXL1' and the first sub-pixel SPX1 of the second pixel PXL2' may have a substantially similar or identical structure to the third sub-pixel SPX3 of the first pixel (refer to "PXL1" in FIG. 7) and the first sub-pixel SPX1 of the second pixel (refer to "PXL2" in FIG. 7).

Figure 14:
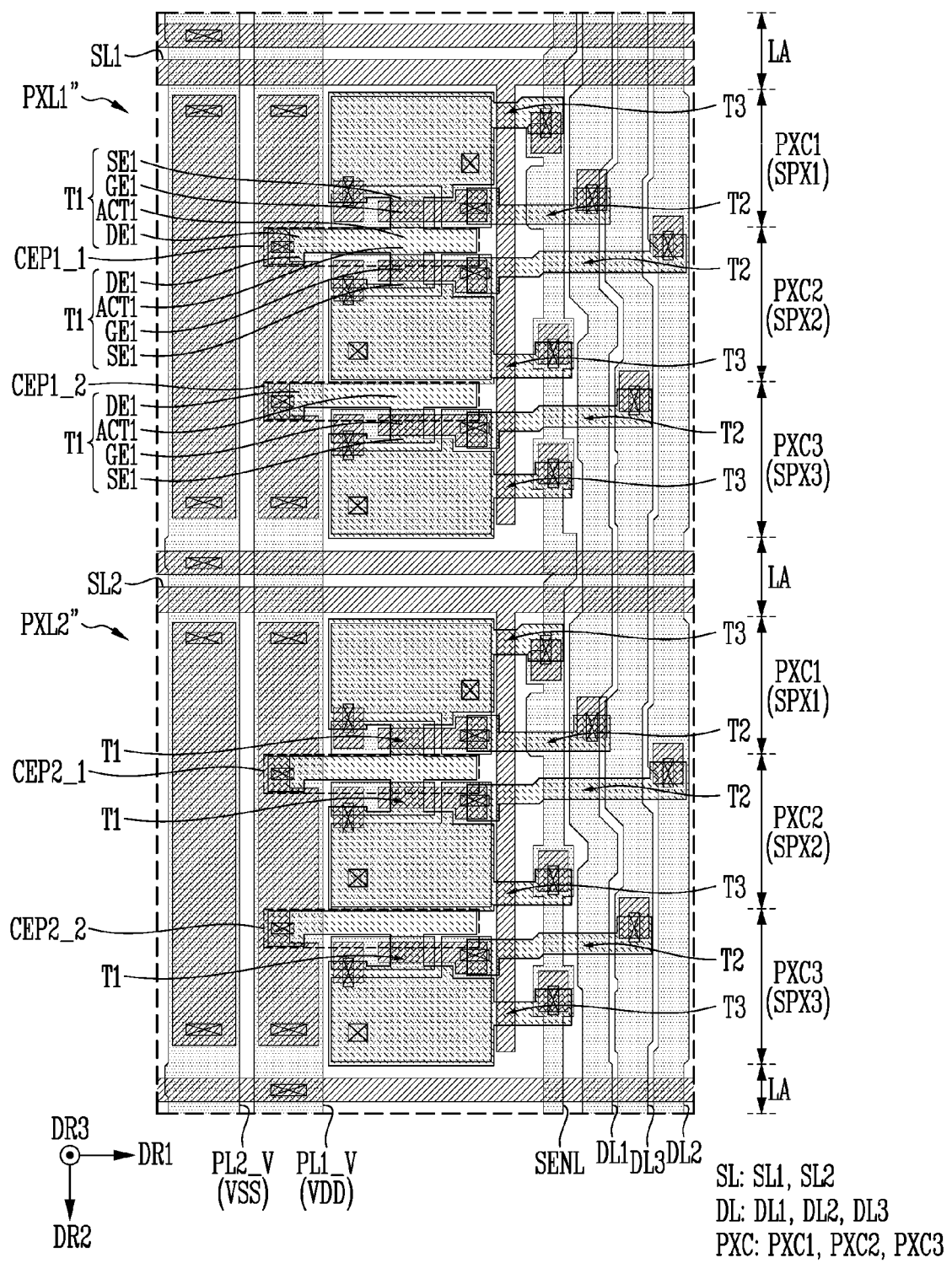
FIG. 14 illustrates a schematic top plan view of another example of a first pixel and a second pixel of FIG. 1.
Figure 15:
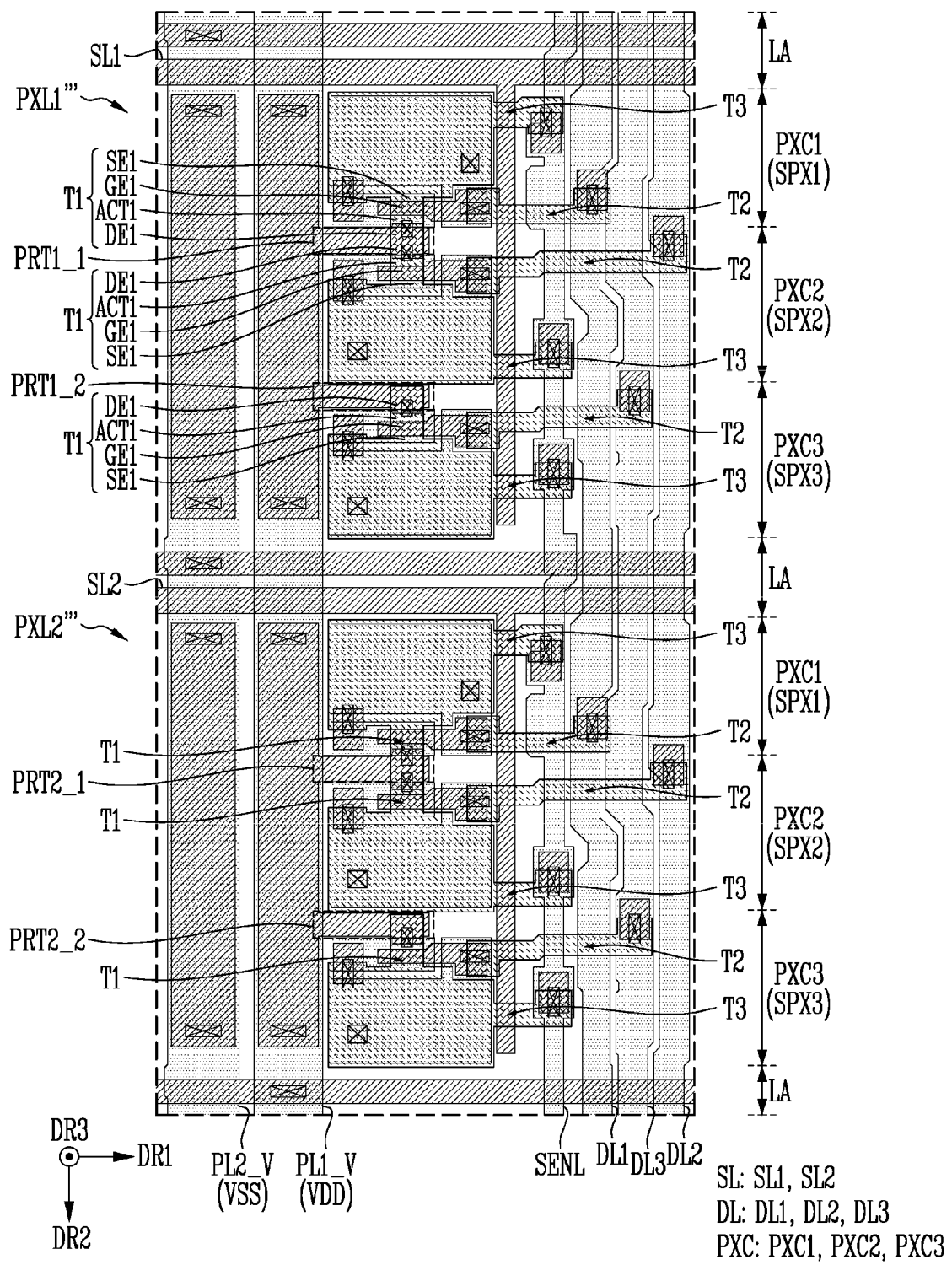
FIG. 15 illustrates a schematic top plan view of another example of a pixel and a second pixel of FIG. 1.

Hereinafter, FIG. 14 and FIG. 15 illustrate embodiments in which the first and second pixels have substantially the same structure.

FIG. 14 illustrates a schematic top plan view of another example of the first pixel and the second pixel of FIG. 1.

Referring to FIG. 14, the display device may include a first pixel PXL1" and a second pixel PXL2" that are sequentially disposed in the second direction DR2.

The first pixel PXL1" and the second pixel PXL2" may have substantially similar or identical structures.

The first pixel PXL1" may include a (1_1)-th common pattern CEP1_1 (or a first electrode pattern) and a (1_2)-th common pattern CEP1_2 (or a second electrode pattern).

In the embodiment, the (1_1)-th common pattern CEP1_1 may be disposed between the first sub-pixel SPX1 and the second sub-pixel SPX2 of the first pixel PXL1". The (1_2)-th common pattern CEP1_2 may be disposed between the second sub-pixel SPX2 and the third sub-pixel SPX3 of the first pixel PXL1".

In the embodiment, the (1_1)-th common pattern CEP1_1 may correspond to the first common pattern CEP1 shown in FIG. 7. The first sub-pixel SPX1 and the second sub-pixel SPX2 of the first pixel PXL1" may share the first drain electrode DE1 and the (1_1)-th common pattern CEP1_1. For example, the (1_1)-th common pattern CEP1_1 may form the first active pattern ACT1 of the first sub-pixel SPX1 of the first pixel PXL1" and the first active pattern ACT1 of the second sub-pixel SPX2.

The first source electrode SE1 of the first sub-pixel SPX1 of the first pixel PXL1" and the first source electrode SE1 of the second sub-pixel SPX2 may be separate electrodes branched from the (1_1)-th common pattern CEP1_1. The first source electrode SE1 of the first sub-pixel SPX1 of the first pixel PXL1" and the first source electrode SE1 of the second sub-pixel SPX2 may be connected to the (1_1)-th common pattern CEP1_1.

The (1_2)-th common pattern CEP1_2 may be disposed between the second sub-pixel SPX2 of the first pixel PXL1" and the third sub-pixel SPX3 of the first pixel PXL1".

The third sub-pixel SPX3 of the first pixel PXL1" may be electrically connected to the first vertical power line PL1_V through the (1_2)-th common pattern CEP1_2. The (1_2)-th common pattern CEP1_2 may form the first active pattern ACT1 of the third sub-pixel SPX3 of the first pixel PXL1".

The second pixel PXL2" may include a (2_1)-th common pattern CEP2_1 and a (2_2)-th common pattern CEP2_2.

The (2_1)-th common pattern CEP2_1 may be disposed between the first sub-pixel SPX1 and the second sub-pixel SPX2 of the second pixel PXL2".

The (2_2)-th common pattern CEP2_2 may be disposed between the second sub-pixel SPX2 and the third sub-pixel SPX3 of the second pixel PXL2".

Since the second pixel PXL2" has substantially the same structure as the first pixel PXL1", the (2_1)-th common pattern CEP2_1 of the second pixel PXL2" may correspond to the (1_1)-th common pattern CEP1_1 of the first pixel PXL1", and the (2_2)-th common pattern CEP2_2 of the second pixel PXL2" may correspond to the (1_2)-th common pattern CEP1_2 of the first pixel PXL1".

FIG. 15 illustrates a schematic top plan view of another example of the pixel and the second pixel of FIG. 1.

Referring to FIG. 15, the display device may include a first pixel PXL1''' and a second pixel PXL2''' that are sequentially disposed in the second direction DR2.

The first pixel PXL1''' and the second pixel PXL2''' may have substantially similar or identical structures.

The first pixel PXL1''' may include a (1_1)-th protruding pattern PRT1_1 (or a first electrode pattern) and a (1_2)-th protruding pattern PRT1_2 (or a second electrode pattern).

The (1_1)-th protruding pattern PRT1_1 may be an electrode extending from the first vertical power line PL1_V between the first sub-pixel SPX1 and the second sub-pixel SPX2 of the first pixel PXL1'''. In one example, the (1_1)-th protruding pattern PRT1_1 may correspond to the first protruding pattern PRT1 shown in FIG. 13.

The (1_2)-th protruding pattern PRT1_2 may be an electrode extending from the first vertical power line PL1_V between the second sub-pixel SPX2 and the third sub-pixel SPX3 of the first pixel PXL1'''.

The (1_1)-th protruding pattern PRT1_1 and the (1_2)-th protruding pattern PRT1_2 may be electrodes protruding in the first direction DR1 from the first vertical power line PL1_V. The (1_1)-th protruding pattern PRT1_1 and the (1_2)-th protruding pattern (PRT1_2) may be integral with the first vertical power line PL1_V. The (1_1)-th protruding pattern PRT1_1 and the (1_2)-th protruding pattern (PRT1_2) may be disposed on the same conductive layer as the first vertical power line PL1_V.

The first gate electrode GE1 of each of the first sub-pixel SPX1 and the second sub-pixel SPX2 of the first pixel PXL1''' may directly contact the (1_1)-th protruding pattern PRT1_1. The first gate electrode GE1 of the third sub-pixel SPX3 of the first pixel PXL1''' may directly contact the (1_1)-th protruding pattern PRT1_2.

The second pixel PXL2''' may include a (2_1)-th protruding pattern PRT2_1 and a (2_2)-th protruding pattern PRT2_2.

The (2_1)-th protruding pattern PRT2_1 may be an electrode extending from the first vertical power line PL1_V between the first sub-pixel SPX1 and the second sub-pixel SPX2 of the second pixel PXL2'''.

The (2_2)-th protruding pattern RPT2_2 may be an electrode extending from the first vertical power line PL2_V between the second sub-pixel SPX2 and the third sub-pixel SPX3 of the second pixel PXL2'''.

Since the second pixel PXL2''' has substantially the same structure as the first pixel PXL1''', the (2_1)-th protruding pattern PRT2_1 may correspond to the (1_1)-th protruding pattern PRT1_1 of the first pixel PXL1'''. The (2_2)-th protruding pattern PRT2_2 may correspond to the (1_2)-th protruding pattern (PRT1_2) of the first pixel PXL1'''. However, it is not limited to this, and the (2_1)-th protruding pattern PRT2_1 and the (2_2)-th protruding pattern PRT2_2 may have different electrical connections from the (1_1)-th protruding pattern PRT1_1 and the (1_2)-th protruding pattern PRT1_2 of the first pixel PXL1'''.

While this disclosure has been described in connection with what is considered to be practical embodiments, it is to be understood that the disclosure is not limited to the disclosed embodiments, but, on the contrary, is intended to cover various modifications and equivalent arrangements and included within the spirit and scope of the appended claims.

What is claimed is:

1. A display device comprising:
   a first pixel disposed on a substrate;
   a second pixel spaced apart from the first pixel in a first direction;
   a first vertical power line extending in the first direction and receiving a first power source; and
   a first horizontal power line extending in a second direction intersecting the first direction between the first pixel and the second pixel and receiving the first power source, wherein
   each of the first pixel and the second pixel includes a first sub-pixel, a second sub-pixel and a third sub-pixel sequentially disposed in the first direction,
   the first pixel includes a first common pattern disposed between the first sub-pixel of the first pixel and the second sub-pixel of the first pixel to extend in the second direction,
   the first sub-pixel of the first pixel and the second sub-pixel of the first pixel share the first common pattern and are electrically connected to the first vertical power line by way of the first common pattern, and
   the third sub-pixel of the first pixel and the first sub-pixel of the second pixel share the first horizontal power line and
   the first common pattern forms a channel area of a transistor of each of the first sub-pixel of the first pixel and the second sub-pixel of the first pixel.

2. The display device of claim 1, wherein each of the first sub-pixel, the second sub-pixel and the third sub-pixel include:
   a light emitting element;
   a first transistor controlling a current of the light emitting element; and
   a storage capacitor that includes a lower electrode electrically connected to a gate electrode of the first transistor, and an upper electrode electrically connected to a source electrode of the first transistor.

3. The display device of claim 2, wherein the first common pattern is an active pattern of the first transistor of the first sub-pixel of the first pixel and an active pattern of the first transistor of the second sub-pixel of the first pixel.

4. The display device of claim 2, wherein the first common pattern is a protruding pattern protruding from the first vertical power line in the second direction.

5. The display device of claim 4, wherein the first common pattern and the first vertical power line are disposed on a same layer.

6. The display device of claim 2, wherein the second pixel is symmetrical to the first pixel about an axis in the second direction.

7. The display device of claim 6, further comprising:
a second common pattern extending in the second direction between the second sub-pixel of the second pixel and the third sub-pixel of the second pixel,
wherein the second sub-pixel of the second pixel and the third sub-pixel of the second pixel are electrically connected to the first vertical power line through the second common pattern.

8. The display device of claim 2, further comprising:
a second power line receiving a second power source different from the first power source;
a sensing line that transmits a sensing signal to each of the first sub-pixel, the second sub-pixel and the third sub-pixel and extends in the first direction; and
a data line that transmits a data signal to each of the first sub-pixel, the second sub-pixel and the third sub-pixel and extends in the first direction, wherein
the second power line and the first vertical power line are disposed at a left side of the storage capacitor, and
the sensing line and the data line are disposed at a right side of the storage capacitor.

9. The display device of claim 8, wherein each of the first sub-pixel, the second sub-pixel and the third sub-pixel further includes:
a second transistor electrically connected between the data line and the gate electrode of the first transistor and turned on by a scan signal; and
a third transistor electrically connected to the sensing line and the upper electrode of the storage capacitor and turned on by a control signal different than the scan signal.

10. The display device of claim 9, wherein the upper electrode of the storage capacitor and an active pattern of each of the first transistor, the second transistor, and the third transistor are disposed on a same layer.

11. The display device of claim 10, wherein the upper electrode of the storage capacitor is integral with the source electrode of the first transistor and a source electrode of the third transistor.

12. The display device of claim 2, wherein
the light emitting element includes:
a first electrode;
a light emitting layer disposed on the first electrode; and
a second electrode disposed on the light emitting layer, and
the first electrode is electrically connected to the source electrode of the first transistor through a contact portion.

13. The display device of claim 1, wherein the first common pattern is a conductive pattern doped with an N+ type dopant.

14. The display device of claim 1, wherein
the first sub-pixel emits light of a first color,
the second sub-pixel emits light of a second color different from the first color,
the third sub-pixel emits light of a third color different from the first color and the second color.

15. The display device of claim 1, further comprising:
a third pixel spaced apart from the second pixel in the first direction, wherein
the third pixel includes the first sub-pixel, the second sub-pixel and the third sub-pixel of the first pixel, and the display device further includes:
a second horizontal power line supplying a second power source between the second pixel and the third pixel;
a second scan line of the second pixel disposed between the third sub-pixel of the second pixel and the second horizontal power line and extends in the second direction; and
a third scan line of the third pixel disposed between the second horizontal power line and the first sub-pixel of the third pixel and extending in the second direction.

16. A display device comprising:
a first pixel disposed on a substrate; and
a first vertical power line extending in a first direction and supplying a first power source, wherein
the first pixel includes:
a first sub-pixel, a second sub-pixel and a third sub-pixel disposed sequentially in the first direction;
a first electrode pattern disposed between the first sub-pixel of the first pixel and the second sub-pixel of the first pixel and extending in a second direction intersecting the first direction; and
a second electrode pattern disposed between the second sub-pixel of the first pixel and the third sub-pixel of the first pixel and extending in the second direction
the first sub-pixel of the first pixel and the second sub-pixel of the first pixel share the first electrode pattern to be electrically connected to the first vertical power line, and
the third sub-pixel of the first pixel is electrically connected to the first vertical power line through the second electrode pattern, and
the first electrode pattern forms a channel area of a transistor of each of the first sub-pixel of the first pixel and the second sub-pixel of the first pixel.

17. The display device of claim 16, wherein
each of the first sub-pixel, the second sub-pixel and the third sub-pixel includes:
a light emitting element;
a first transistor controlling a current of the light emitting element; and
a storage capacitor that includes a lower electrode electrically connected to a gate electrode of the first transistor and an upper electrode electrically connected to a source electrode of the first transistor, and
the first electrode pattern is an active pattern of the first transistor of the first sub-pixel of the first pixel and an active pattern of the first transistor of the second sub-pixel of the first pixel.

18. The display device of claim 16, further comprising:
a second pixel spaced apart from the first pixel in the first direction,
wherein the second pixel and the first pixel have a same structure.

19. The display device of claim 16, wherein each of the first electrode pattern and the second electrode pattern is a power line protruding from the first vertical power line in the second direction.

20. The display device of claim 16, wherein the first electrode pattern and the second electrode pattern are conductive patterns doped with an N+ type dopant.

* * * * *